United States Patent [19]
Tanoi

[11] Patent Number: 5,708,621
[45] Date of Patent: Jan. 13, 1998

[54] SEMICONDUCTOR MEMORY WITH IMPROVED WORD LINE STRUCTURE

[75] Inventor: Satoru Tanoi, Tokyo, Japan

[73] Assignee: Oki Electric Industry Co., Ltd., Tokyo, Japan

[21] Appl. No.: 659,057

[22] Filed: Jun. 4, 1996

[30] Foreign Application Priority Data

Jul. 3, 1995 [JP] Japan .................................. 7-167500

[51] Int. Cl.⁶ .................................................... G11C 8/00
[52] U.S. Cl. ...................... 365/230.06; 365/51; 365/63
[58] Field of Search ............................ 365/51, 63, 72, 365/230.06

[56] References Cited

U.S. PATENT DOCUMENTS

| | | | |
|---|---|---|---|
| 4,827,449 | 5/1989 | Inoue | 365/63 |
| 5,214,601 | 5/1993 | Hidaka et al. | 365/63 |
| 5,319,605 | 6/1994 | Min et al. | 65/230.06 |
| 5,384,726 | 1/1995 | Tomita et al. | 365/63 |
| 5,506,816 | 4/1996 | Hirose et al. | 365/51 |

FOREIGN PATENT DOCUMENTS 4-352469  12/1992  Japan .

OTHER PUBLICATIONS

Ito, VLSI Memories, Baifukan, 1994, pp. 85–89, 125–127, 140–141, 158–161.
Sugano, CMOS VLSI Design, Baifukan, 1989, pp. 141–142.

*Primary Examiner*—David C. Nelms
*Assistant Examiner*—Hien Nguyen

[57] ABSTRACT

According to one aspect of the invention, a semiconductor memory has, as word lines, a layer of high-resistance signal lines that are paralleled in a separate layer by low-resistance signal lines. Each high-resistance signal line is divided into segments separated by gaps. Interconnections between the high- and low-resistance signal lines in each word line are aligned with the gaps in the high-resistance signal lines in the adjacent word lines. According to a second aspect of the invention, the low-resistance signal lines extend, from alternate directions, to approximately the midpoints of the high-resistance signal lines. The high-resistance signal lines are undivided, or are divided into only two segments apiece. The high- and low-resistance signal lines are interconnected at the midpoints, or at the midpoints and one end.

23 Claims, 20 Drawing Sheets

SEMICONDUCTOR MEMORY WITH IMPROVED WORD LINE STRUCTURE

BACKGROUND OF THE INVENTION

The present invention relates to an improvement in the word-line structure of a semiconductor memory, the improvement being particularly suited for use in dynamic random-access memories.

Increased bit capacities and densities in semiconductor memories have led to the following problem on the word lines that select memory cells. Since the word lines function as the gate electrodes of transistors in the memory cells, the word lines are fabricated from polysilicon, which has significant electrical resistivity. The resistivity can be reduced by mixing the polysilicon with a metal silicide such as tungsten silicide, but the resulting mixture, commonly referred to as polycide, still has significant resistivity, much greater than the resistivity of a metal such as aluminum. Because of this comparatively high resistivity, and because of the large number of transistors on each word line, the word lines present significant resistive (R) and capacitive (C) loads, and the attendant RC signal propagation delay slows the operation of the memory.

This problem has been attacked through three strategies in the prior art.

A first strategy places the driver circuit of each word line in the center of the word line, thus splitting the word line into two halves. Each half has only half the resistance and half the capacitance of the full word line, so the RC propagation delay is reduced by a factor of four. This strategy was used in memories with capacities measured in kilobits, but was inadequate for megabit memories.

A second strategy adds an aluminum shunt line, which has very low electrical resistance, above each polysilicon or polycide word line. The word line and shunt line are coupled at N+1 points, including the end points of the lines, by contact holes filled with interconnecting plugs of aluminum (N is an integer greater than one). This strategy reduces the RC delay by a factor of $4N^2$, and has been used in one- and four-megabit memories.

In memories with higher integration densities, however, the second strategy encounters a further problem. To allow for mask alignment error in the fabrication process, the word lines and their aluminum shunt lines must be locally broadened at the points of contact with the aluminum interconnecting plugs. The consequent narrow spacing between adjacent lines at the interconnecting plugs makes fabrication difficult, and adversely affects production yields.

Memories with higher integration densities have, therefore, often adopted a third strategy. The third strategy divides the memory cell array into subarrays, so that each word line is divided into a corresponding plurality of shorter word lines, each shorter word line having its own driver. If a word line is divided into N such shorter word lines, the RC propagation delay is reduced by a factor of $N^2$. The drivers themselves are activated via an aluminum word line which, although long, offers relatively little electrical resistance, has a comparatively small capacitive load, and thus causes little propagation delay.

A problem in this third strategy is that each word line requires N+1 drivers: one for the long aluminum line, and one for each shorter polysilicon or polycide line. The space taken up by the extra driving circuitry adds significantly to the length of the word lines, hence to the size of the memory device. Although a driver for a short polysilicon or polycide word line can use smaller transistors than are needed by a driver for long polysilicon or polycide word line, the size of the driver circuits does not scale down by a factor of N. To achieve a given reduction in propagation delay, the third strategy requires several times as much extra space as the second.

SUMMARY OF THE INVENTION

It is accordingly an object of the present invention to reduce signal propagation delays on word lines without significant lengthening of the word lines.

Another object of the invention is to reduce signal propagation delays on word lines without creating narrow spaces between adjacent word lines.

A further object of the invention is high-yield fabrication of semiconductor memories.

According to a first aspect of the invention, a semiconductor memory has a plurality of drivers and a like plurality of mutually parallel word lines. Each word line comprises a first signal line having a first electrical resistivity and a second signal line having a second, lower electrical resistivity. The first signal line is divided into a plurality of segments separated by gaps. The second signal line is coupled by a separate interconnecting plug to each segment of the first signal line. The interconnecting plugs of each word line are aligned with the gaps in the first signal lines of the adjacent word lines.

According to a second aspect of the invention, a semiconductor memory has memory cells organized into at least one array, with a plurality of first drivers disposed on a first side of the array, and a plurality of second drivers disposed on a second side of the array opposite to the first side. The drivers generate signals that select the memory cells. A plurality of mutually parallel first signal lines extend in a first layer across the array from the first side to the second side. Memory cells are connected to these first signal lines.

A plurality of second signal lines coupled to respective first drivers extend in a second layer from the first side of the array to a central area midway between the first and second sides. A plurality of third signal lines coupled to respective second drivers extend in the same second layer from the second side of the array to the central area. These second and third signal lines are electrically coupled to respective first signal lines in the central area, and have a lower electrical resistivity than do the first signal lines. Each first signal line is coupled to just one signal line among the second and third signal lines. Viewed in a direction perpendicular to the first signal lines, first signal lines coupled to the second signal lines alternate with first signal lines coupled to the third signal lines.

According to a third aspect of the invention, the first signal lines of the second aspect are divided into two segments apiece, one segment being coupled to a second or third signal line as described above, and the other segment being coupled to the same second or third signal line at the first or second side of the array.

In both the second and third aspects of the invention, the second layer may also include fourth signal lines that extend across the array and activate the drivers. Each fourth signal line is then coupled to at least one first driver and at least one second driver.

DETAILED DESCRIPTION OF THE PREFERRED EMBODIMENTS

Embodiments of the invention will be described with reference to the attached illustrative drawings.

Figure 1:
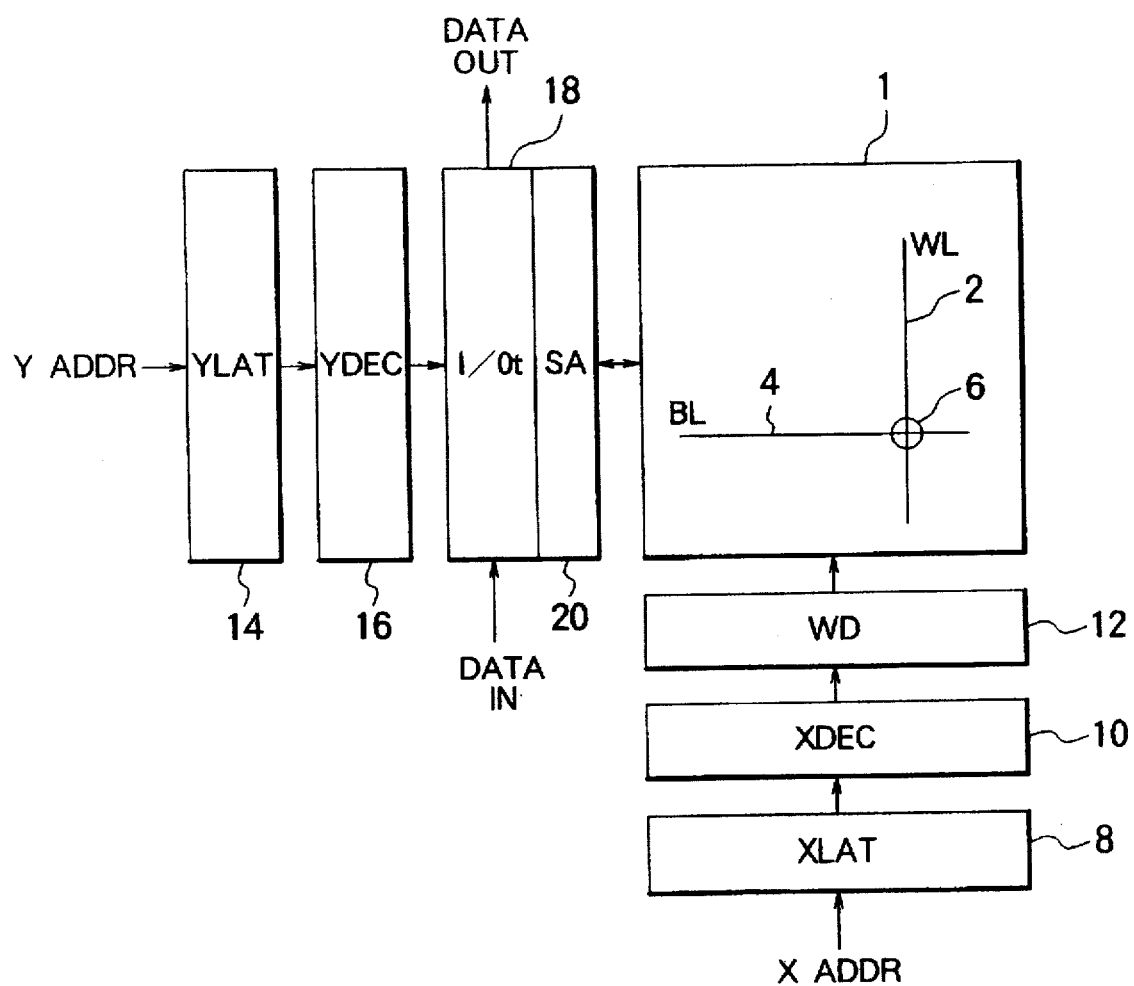
FIG. 1 is a general block diagram of a semiconductor memory, illustrating all embodiments of the invention.

FIG. 1 is a general block diagram of a semiconductor memory of the type to which the invention applies. The memory has a memory cell array 1 with word lines (WL) 2 running in one direction, bit lines (BL) 4 running perpendicular to the word lines 2, and memory cells 6 disposed at the intersections of the word lines 2 and bit lines 4. The array 1 normally has large numbers of word lines, bit lines, and memory cells, although the drawing shows only one of each.

The memory cells are specified by an x-address (X ADDR) which selects a word line 2, and a y-address (Y ADDR) which selects a bit line 4. The x-address is stored in an x-latch (XLAT) 8 and decoded by an x-decoder (XDEC) 10 to activate one of a plurality of word lines drivers (WD) 12. The y-address is stored in a y-latch (YLAT) 14 and decoded by a y-decoder (YDEC) 16 to transfer input data through an input-output transfer (I/Ot) circuit 18 to a selected bit line or pair of bit lines; or to output data from the memory cells 6, after the data have been read onto the bit lines 4 and amplified by a plurality of sense amplifiers 20.

Figure 2:
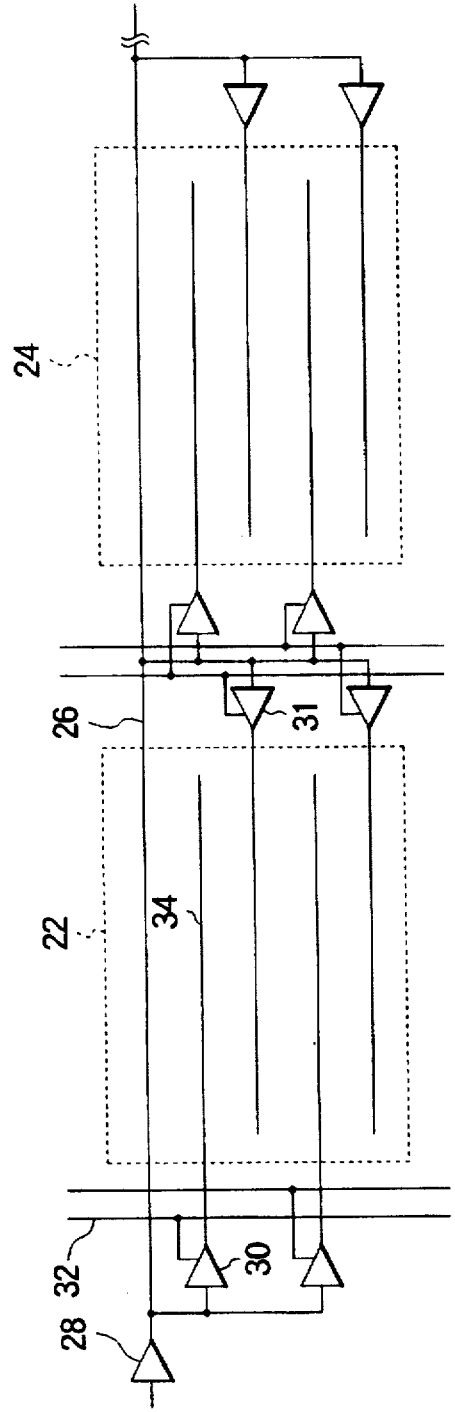
FIG. 2 is an enlarged schematic diagram showing two subarrays into which the memory cell array FIG. 1 may be divided.

The memory cell array 1 may be divided into a plurality of subarrays. As an example, FIG. 2 schematically shows two subarrays 22 and 24, illustrating the structure of one word line. The word line is shown running horizontally in FIG. 2. The bit lines and memory cells have been omitted from FIG. 2 and subsequent drawings to avoid unnecessary clutter.

One part of the word line in FIG. 2, referred to as the main word line 26, is driven by a main word line driver 28, and in turn drives a plurality of subsidiary word line drivers such as drivers 30 and 31. Each subsidiary word line driver is also controlled by a selection signal on a selection line such as selection line 32. Each subsidiary word line driver is adapted to function as a logic gate that produces active output only when the inputs on its selection line and the main word line 26 are both active. If "active" is synonymous with "high," for example, the subsidiary word line drivers function as AND gates. The selection signals are obtained by the decoding of certain address bits.

As shown, the subsidiary word line drivers of each subarray are disposed alternately on the left and right sides of the subarray. Each subsidiary driver drives one subsidiary word line. For example, subsidiary driver 30 drives subsidiary word line 34.

The main word line 26 is an aluminum line, and drives a comparatively small number of transistors in the subsidiary drivers, while the subsidiary word lines 34 comprise polysilicon or polycide, and must each drive a large number of transistors in the numerous connected memory cells (not visible). The resistive and capacitive loads presented by the subsidiary word lines are therefore an order of magnitude larger than the resistive and capacitive loads presented by the main word line. Most of the word-line signal propagation delay occurs on the subsidiary word lines.

Figure 3:
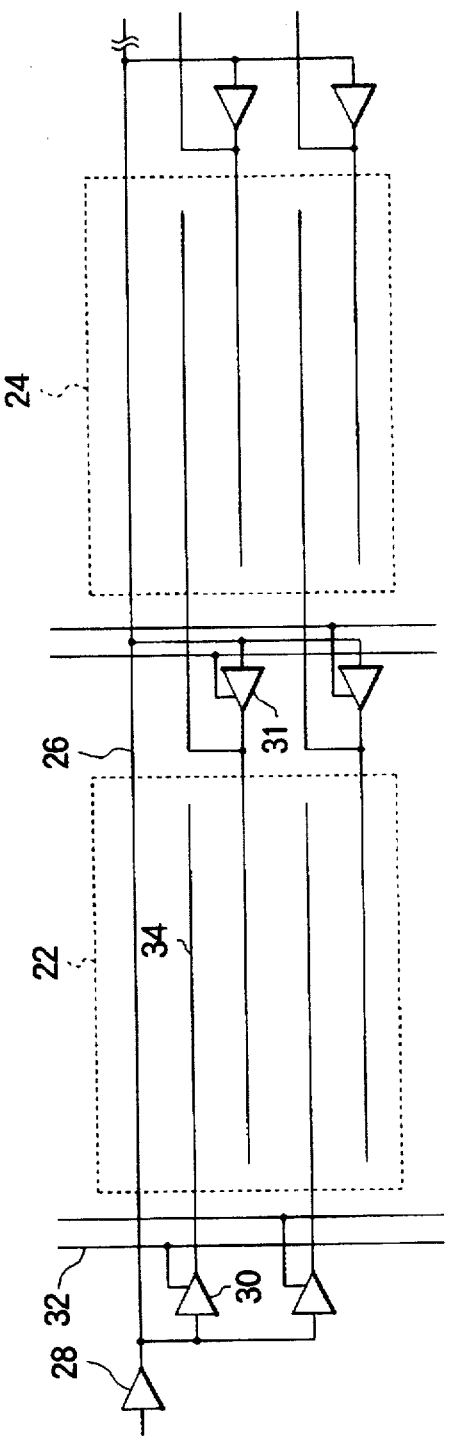
FIG. 3 is another enlarged schematic diagram of two subarrays.

FIG. 3 shows a variation of FIG. 2 in which the number of subsidiary drivers is reduced by having drivers such as driver 31, which are disposed between two subarrays, drive subsidiary word lines in both subarrays. The invention can be practiced using either FIG. 2 or FIG. 3, and other arrangements are also possible.

The subarrays 22 and 24 can be given any desired size by repeating the basic pattern shown in FIG. 2 or 3. Within each subarray, the number of subsidiary word lines connected to each main word line may be two (as shown), or more than two, or only one. These variations also apply to the embodiments described below, except that in the seventh embodiment there must be at least two subsidiary word lines per main word line.

Use of the term "subsidiary" will be discontinued in the following description, because the invention is also applicable to semiconductor memories in which the word lines do not have a hierarchical structure comprising main and subsidiary word lines. For the same reason, the subarrays will be referred to simply as arrays.

First Embodiment

Figure 4:
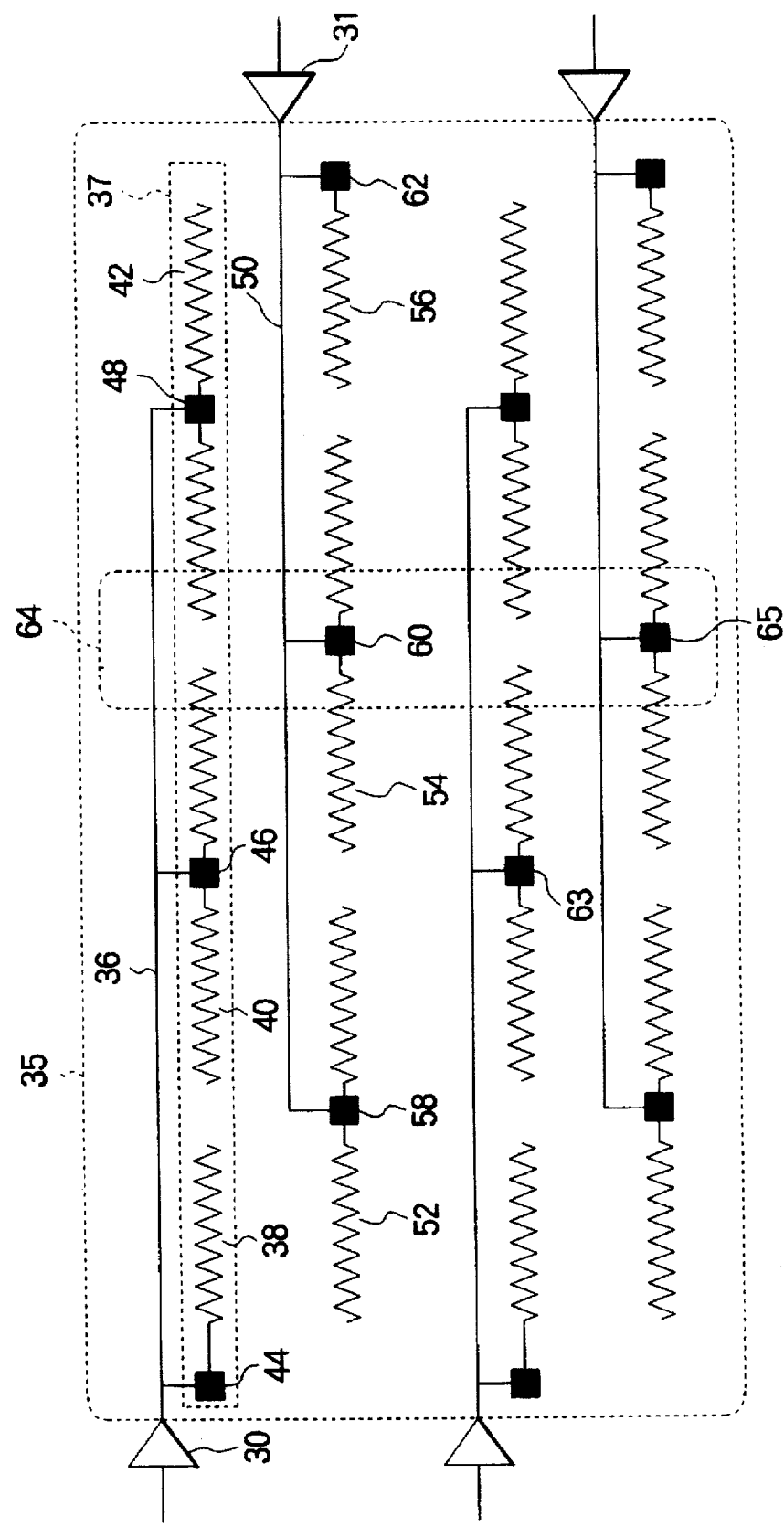
FIG. 4 is a schematic diagram of a memory cell array or subarray illustrating a first embodiment of the invention.

FIG. 4 shows the structure of four word lines in a memory cell array 35 in a first embodiment of the invention. As in FIGS. 2 and 3, drivers 30 and 31 are disposed on two opposite sides of the array 35. The word line driven by driver 30 comprises two signal lines 36 and 37, signal line 36 having a lower electrical resistivity than signal line 37. These two signal lines will be referred to as the low-resistance line 36 and high-resistance line 37. The high-resistance line 37 is divided into collinear segments 38, 40, and 42, to which the low-resistance line 36 is electrically coupled by respective interconnecting plugs 44, 46, and 48.

The word line driven by driver 31 symmetrically comprises a low-resistance line 50, and a high-resistance line divided into segments 52, 54, and 56, to which the low-resistance line 50 is electrically coupled by respective interconnecting plugs 58, 60, and 62. Other word lines in the array have a similar structure. The low-resistance lines and interconnecting plugs comprise tungsten; the high-resistance line segments comprise a material such as polysilicon or polycide. The term "high-resistance" is used in relation to the resistivity of the low-resistance lines, and does not imply that the high-resistance segments have high resistance in an absolute sense.

One feature of this embodiment is that the gaps between the segments of each high-resistance line are aligned with the interconnecting plugs of the adjacent word line or lines. For example, the gap between high-resistance segments 38 and 40 of the word line driven by driver 30 is aligned with the interconnecting plug 58 of the word line driven by driver 31. Similarly, the gap between high-resistance segments 52 and 54 of the word line driven by driver 31 is aligned with interconnecting plug 46 of the word line driven by driver 30, and with interconnecting plug 63 of the next word line.

As a result, the interconnections between the low-resistance and high-resistance parts of each word line are located at points where no high-resistance segments are present in the adjacent word line or word lines. This also holds for the interconnecting plugs 44 and 62 at the ends of the word lines.

Figure 5:
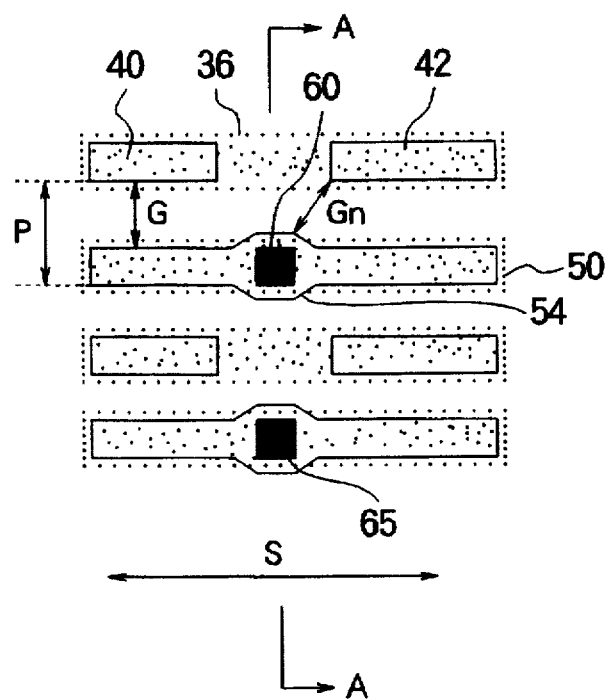
FIG. 5 is a plan view illustrating the layout of an interconnecting area in FIG. 4.

The layout of area 64 in FIG. 4, including interconnecting plugs 60 and 65, is shown in plan view in FIG. 5, using the same reference numerals as in FIG. 4. P denotes the word-line pitch. The width of each word line is substantially one-half P. The spacing G between adjacent word lines is also substantially one-half P.

High-resistance segment 54, indicated by solid lines in the drawing, is broadened in the area around interconnecting plug 60 to provide a mask alignment margin. Because of the absence of high-resistance segments 40 and 42 in the immediate vicinity of interconnecting plug 60, the space Gn between the broadened part of high-resistance segment 54 and high-resistance segment 42 is substantially the same as G. The yield of the fabrication process is therefore not jeopardized by abnormally small spacing between adjacent high-resistance lines.

Low-resistance line 50, indicated by a dotted pattern in the drawing, does not have to be broadened around interconnecting plug 60, because the line 50 and plug 60 are made of tungsten, which is well suited for high-precision fine patterning. Thus the yield of the fabrication process is not jeopardized by abnormally small spacing between adjacent low-resistance lines.

Figure 6:
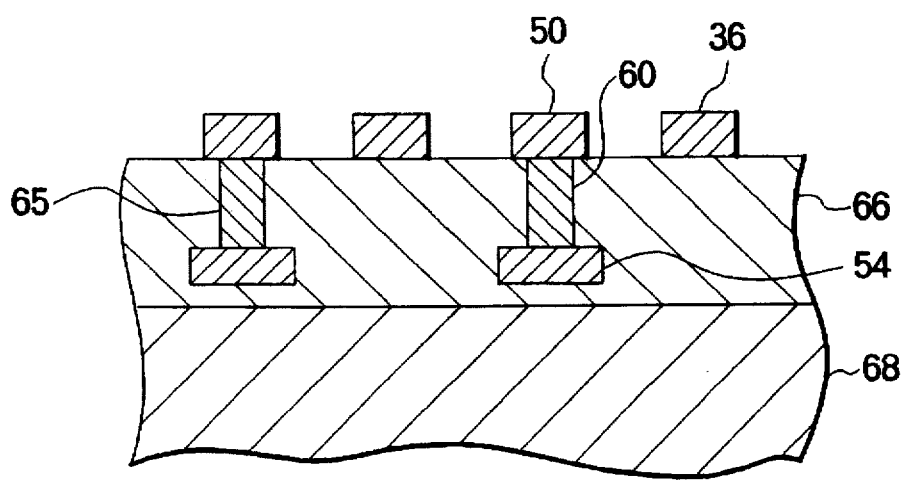
FIG. 6 shows a sectional view through line A—A in FIG. 5.

FIG. 6 shows a sectional view through line A—A in FIG. 5, using the same reference numerals. The tungsten low-resistance lines, e.g. lines 36 and 50, are formed in a single layer on an insulating film 66 in which the interconnecting plugs 60 and 65 and high-resistance line segments, e.g. segment 54, are embedded. The high-resistance lines are formed in a single layer within this insulating film 66. Memory cells and other circuit elements (not visible) are formed in an underlying semiconductor substrate layer 68.

The semiconductor memory may have additional layers of metal interconnecting lines, not visible in FIG. 6. For example, the main word line 26 shown in FIGS. 2 and 3 may be formed in a second interconnecting metal layer, preferably an aluminum layer.

Referring again to FIG. 5, the presence of interconnecting plugs 60 and 65 and gaps between high-resistance segments lengthens the word lines in the area shown by an amount S. Referring again to FIG. 4, there are six such areas with interconnecting plugs or gaps in each word line, so each word line is lengthened by 6S.

The reduction in propagation delay brought about by means of the low-resistance lines can be calculated by regarding each high-resistance line as divided into five sections of equal length, each section being driven from an interconnecting plug at one end. For example, the five sections of high-resistance line 37 are segment 38, the part of segment 40 to the left of interconnecting plug 46, the part of segment 40 to the right of interconnecting plug 46, the part of segment 42 to the left of interconnecting plug 48, and the part of segment 42 to the right of interconnecting plug 48.

Let R and C represent the resistive and capacitive loads of a hypothetical word line consisting of a single, undivided high-resistance line extending from the left side to the right side of the array 35, with no low-resistance line present. The propagation delay on this hypothetical word line is proportional to RC.

Each of the five sections into which the high-resistance line 37 has been divided is similar to the above hypothetical word line scaled down in length by a factor of five, and thus has one-fifth the resistance and one-fifth the capacitance of the hypothetical word line. If the resistance of low-resistance line 36 is ignored, the propagation delay of the word line driven by driver 30 is accordingly now proportional to RC/25.

Figure 7:
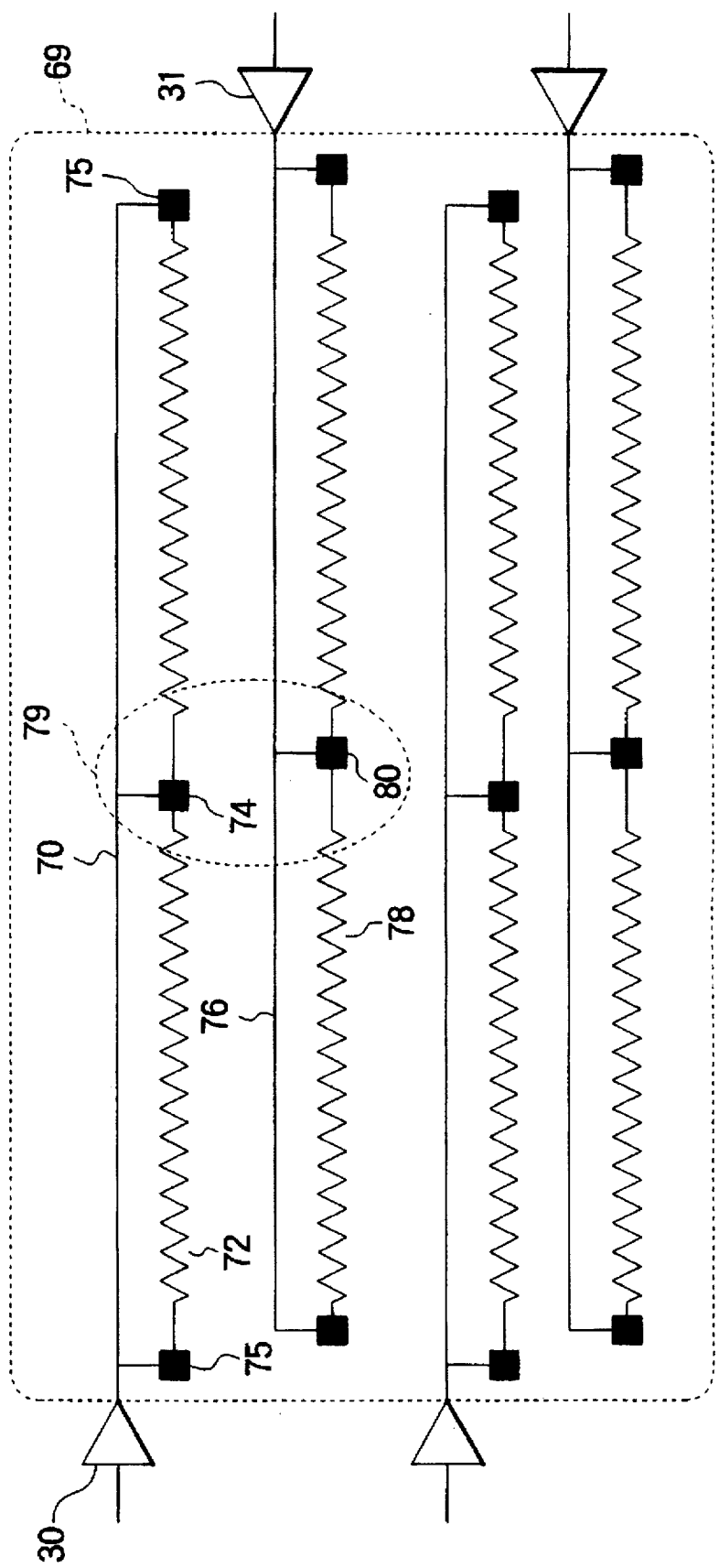
FIG. 7 is a schematic diagram of a prior-art memory cell array.

For comparison, FIG. 7 shows a prior-art array 69 in which driver 30 drives a word line comprising a single low-resistance line 70 coupled to a single, continuous high-resistance line 72 by an interconnecting plug 74 in the center and two more interconnecting plugs 75 at each end. Driver 31 drives a word line comprising a similar low-resistance line 76 and high-resistance line 78.

Figure 8:
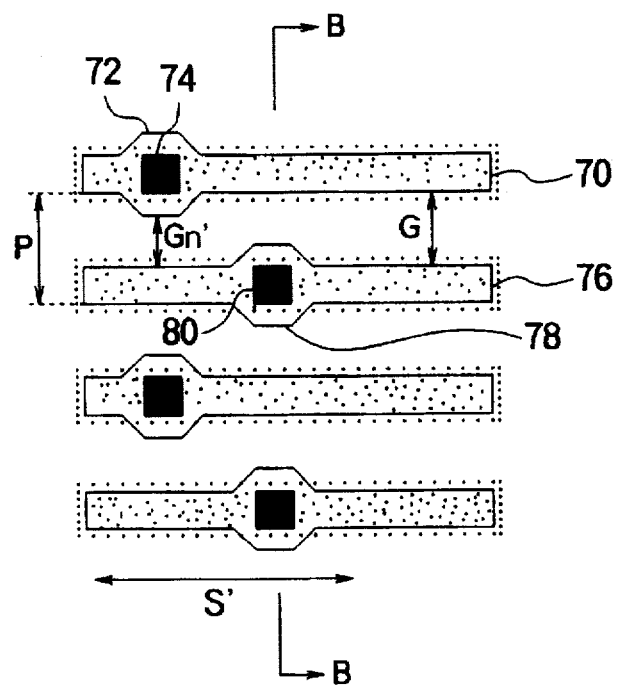
FIG. 8 is a plan view illustrating the layout of an interconnecting area in FIG. 7.

FIG. 8 shows a plan view of the layout of area 79 in FIG. 7, including adjacent interconnecting plugs 74 and 80. Even though the locations of the interconnecting plugs are staggered, the necessary broadening of high-resistance lines 70 and 78 creates a narrow space of dimension Gn' between each broadened part and the adjacent high-resistance line. If dimensions P and G are the same as in FIG. 5, dimension Gn' will be considerably narrower than dimension G, creating fabrication difficulties and adversely affecting production yields.

Figure 9:
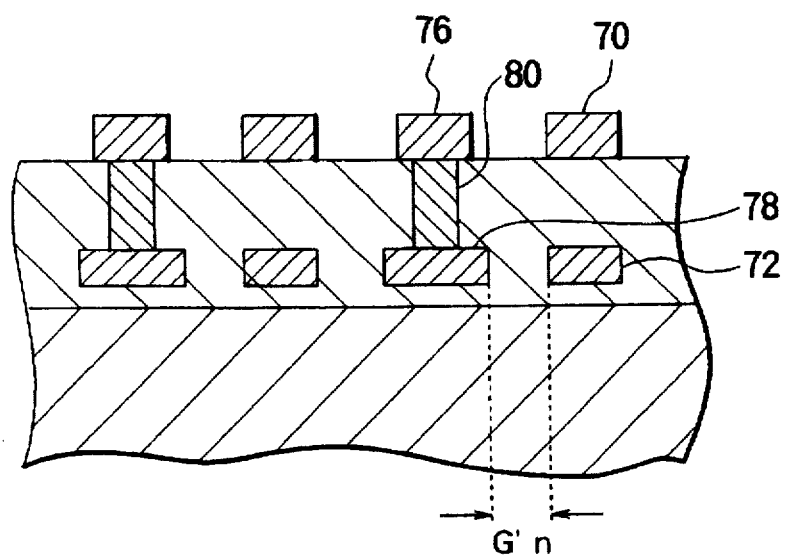
FIG. 9 shows a sectional view through line B—B in FIG. 8.

FIG. 9 shows a sectional view through line B—B in FIG. 8, illustrating the narrow spacing Gn' between the broadened part of high-resistance line 78 and the adjacent high-resistance line 72.

Referring again to FIG. 8, the word lines must be lengthened by an amount S' to accommodate the staggered interconnecting plugs, this quantity S' being substantially 1.4 times greater than the corresponding S in FIG. 5. Referring again to FIG. 7, each word line is lengthened at three points, so the total lengthening is 3S' or substantially 4.2S.

The reduction in propagation delay by the low-resistance line 70 can be calculated by regarding the high-resistance line 72 as divided into four equal sections, each driven from one end, and again letting R and C denote the total resistive and capacitive loads of high-resistance line 72 in the absence of low-resistance line 70. Low-resistance line 70 can be seen to reduce the propagation delay from a value proportional to RC to a value substantially proportional to RC/16.

Thus the prior-art array 69 in FIG. 7 has shorter word lines than the first embodiment array 35 in FIG. 4 (4.2S<6S), but the first embodiment array 35 has less propagation delay (RC/25<RC/16). Both arrays use the same number of interconnecting plugs.

For a more general comparison of the first embodiment with the prior art, it is useful to regard segment 38 in FIG. 4 as a half-segment, to consider high-resistance line 37 to be divided into two and one-half segments, and to regard high-resistance word line 70 in FIG. 7 as divided into two segments. Then in both cases the propagation delay is reduced by a factor of $4N^2$, where N is the number of segments. The extra length required is $(2N+1)S$ in the first embodiment, and $(N+1)S'$ or substantially $(1.4N+1.4)S$ in the prior art. Both cases require N+1 interconnecting plugs per word line.

Thus with only a slightly greater increase in the length of the word lines, $(2N+1)S$ instead of $(1.4N+1.4)S$, the first embodiment achieves the same degree of reduction in propagation delay as in the prior art $(4N^2)$, and facilitates high-yield fabrication by providing adequate spacing between adjacent word lines at all points.

The above formulas hold true for arbitrary values of N. For example, if the word lines in the first embodiment are divided into five and one-half segments each, (five segments having interconnecting plugs at their midpoints, and one short segment with an interconnecting plug at one end), the propagation delay becomes proportional to RC/121. If the word lines are divided into seven and one-half segments, the propagation delay becomes proportional to RC/225.

The configuration shown in FIG. 4 is symmetric in that all word lines are structurally identical. This symmetry is not strictly necessary, so the parameter N in the first embodiment can be made into a whole number as follows. Each word line driven from one side of the array is divided into N equal segments. Each word line driven from the other side of the array is divided into N−1 equal segments plus two shorter half-segments, one half-segment disposed at each end of the word line. The propagation delay is still reduced by a factor of $4N^2$.

Second Embodiment

The second embodiment also has the configuration shown in FIG. 4, but the geometry of the interconnecting areas has been slightly modified to permit the use of aluminum for the low-resistance lines.

Figure 10:
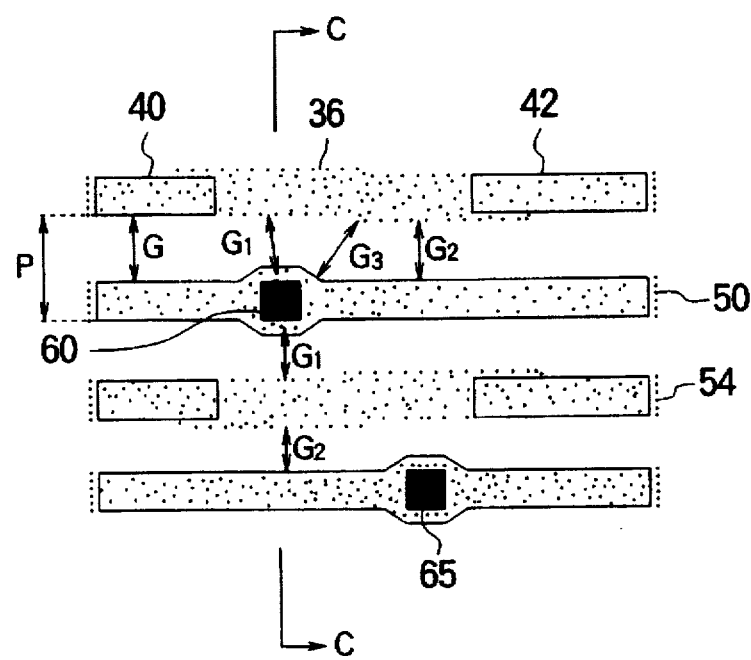
FIG. 10 is a plan view illustrating the layout of an interconnecting area in a second embodiment of the invention.

FIG. 10 shows the layout of area 64 in the second embodiment, using the same reference numerals as in FIG. 4. The difference from FIG. 5 is that the low-resistance lines are slightly broadened around each interconnecting plug, e.g. low-resistance line 50 is broadened around interconnecting plug 60. Moreover, where each low-resistance line is broadened, the adjacent low-resistance lines are shifted slightly away from the broadened part, e.g. line 36 detours slightly upward in the area above interconnecting plug 60. By suitable adjustment of the amount of broadening of the low-resistance lines and the size of the detours, the spacing dimensions $G_1$, $G_2$, and $G_3$ between the low-resistance lines can be kept large enough to obtain good production yields, while the broadening of the low-resistance lines enables aluminum to be used instead of tungsten. This is desirable because aluminum has a lower electrical resistivity than tungsten.

Figure 11:
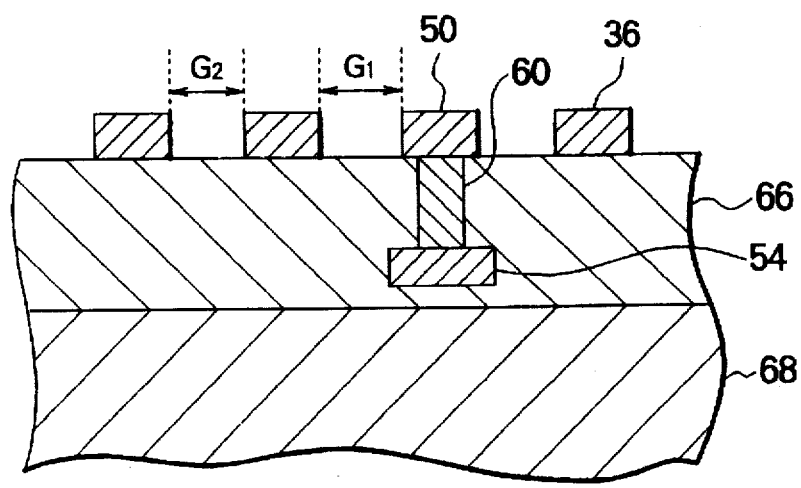
FIG. 11 shows a sectional view through line C—C in FIG. 10.

FIG. 11 shows a sectional view through line C—C in FIG. 10, using the same reference numerals as in FIGS. 6 and 10 and illustrating the above spacing dimensions $G_1$ and $G_2$.

The preceding two embodiments offered improvements in the second prior-art strategy of linking each high-resistance word line to a low-resistance shunt line at a plurality of points. The following embodiments offer improvements in the third strategy, of dividing a word line into shorter, independently driven word lines. The third to sixth embodiments, however, are also applicable to a semiconductor memory with a single memory-cell array.

Third Embodiment

Figure 12:
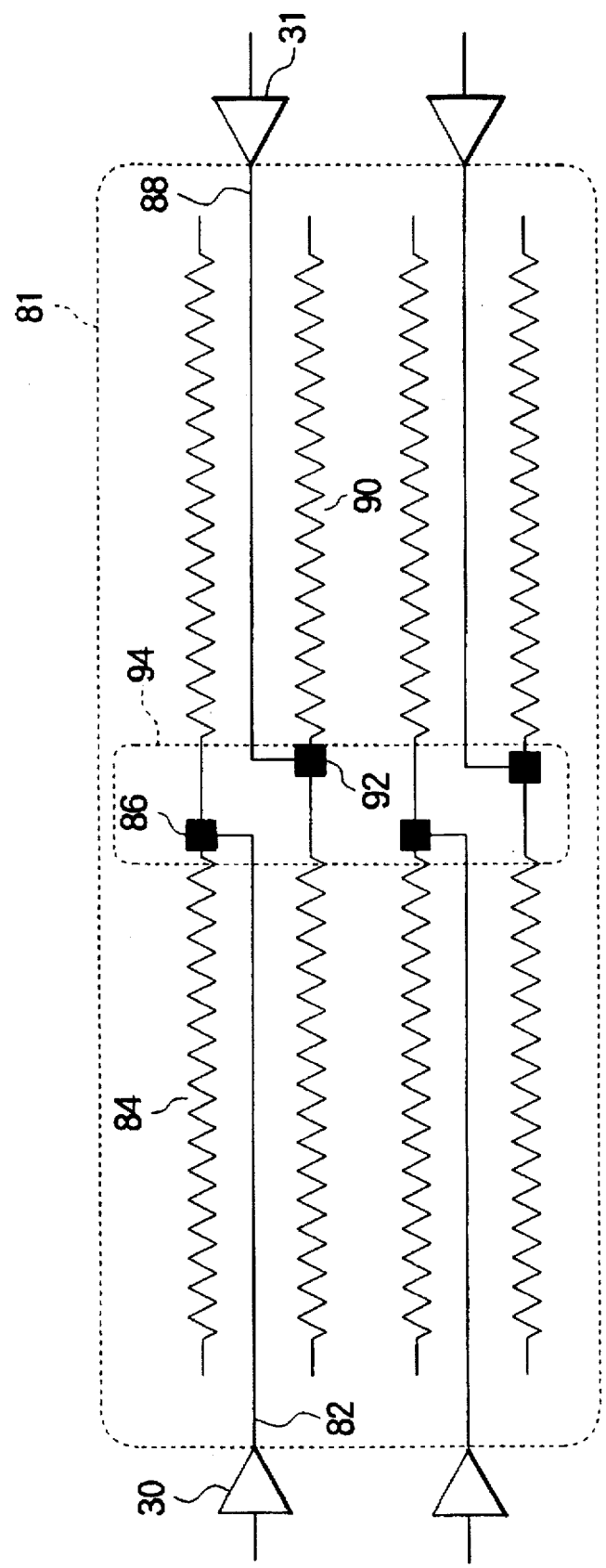
FIG. 12 is a schematic diagram of a memory cell array or subarray illustrating a third embodiment of the invention.

FIG. 12 shows part of a memory cell array 81 that, like the array 22 in FIGS. 2 and 3, has word line drivers 30 and 31 disposed on two opposite sides.

Driver 30 drives a low-resistance line 82 that is coupled to a high-resistance line 84 by an interconnecting plug 86 disposed near the center of high-resistance line 84. Similarly, driver 31 drives a low-resistance line 88 that is coupled to a high-resistance line 90 by an interconnecting plug 92 disposed near the center of high-resistance line 90. The interconnecting plugs are staggered, interconnecting plug 86 being located to the left of interconnecting plug 92. Low-resistance line 82 extends only as far as interconnecting plug 86, and low-resistance line 88 only as far as interconnecting plug 90.

The low-resistance lines 82 and 88 are made of aluminum. The high-resistance lines 84 and 90 comprise a material such as polysilicon or polycide. The memory cells (not visible) are attached to the high-resistance lines.

Figure 13:
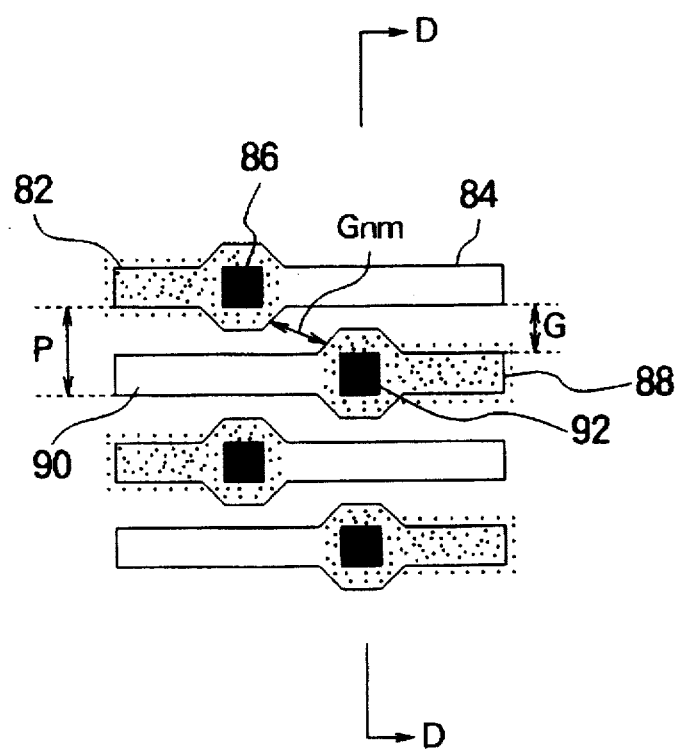
FIG. 13 is a plan view illustrating the layout of the central area in FIG. 12.

The layout of the central area 94 containing interconnecting plugs 88 and 92 is shown in plan view in FIG. 13, using the same reference numerals as in FIG. 12. As in the preceding embodiments, the spacing G between adjacent word lines is substantially one-half the word-line pitch P.

Both the low-resistance lines 82 and 88 and the high-resistance lines 84 and 90 are broadened in the areas around the interconnecting plugs 86 and 92. Because of the staggering of the locations of the interconnecting plugs, however, the spacing Gnm between the ends of low-resistance lines 82 and 88 is even greater than the spacing G between adjacent word lines.

An advantage of the third embodiment over the first two embodiments is that, viewed along line D—D, the low-resistance lines are spaced twice as far apart: at a line pitch of 2P instead of P. This makes the metalization process that forms the low-resistance lines much easier to carry out in the third embodiment. The difficulty of metalization tends to be exponentially related to the line pitch.

Figure 14:
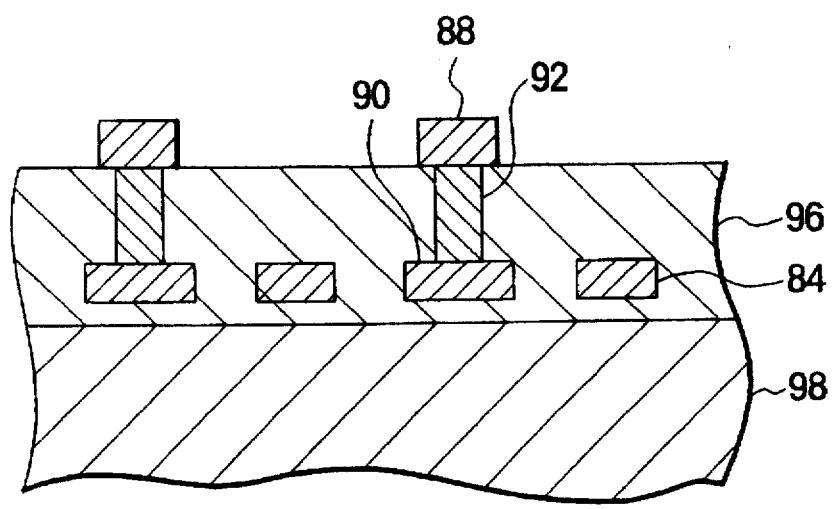
FIG. 14 shows a sectional view through line D—D in FIG. 13.

FIG. 14 is a sectional view through line D—D in FIG. 13, illustrating the very wide spacing on both sides of low-resistance line 88. As in the preceding embodiments, the high-resistance lines, such as lines 84 and 90, are embedded in a single layer in an insulating film 96 overlying a semiconductor substrate layer 98, while the low-resistance lines are formed in another single layer on the insulating film 96.

To compare the propagation delay in the third embodiment with the delay in the first two embodiments, it is necessary to assume that the word lines in FIG. 12 are coupled to only 1/N as many memory cells as the word lines in FIGS. 4 and 7; i.e. that the memory cell array has been more finely divided into subarrays. In that case the propagation delay in the third embodiment has already been reduced by a factor of $N^2$ by shortening the word lines by a factor of N, reducing their resistance and capacitance by similar factors of N. By driving each high-resistance line from a point in its center, the third embodiment reduces the propagation delay by a further factor of four, so the total reduction in propagation delay is by a factor of $4N^2$, as in the first two embodiments.

Figure 15:
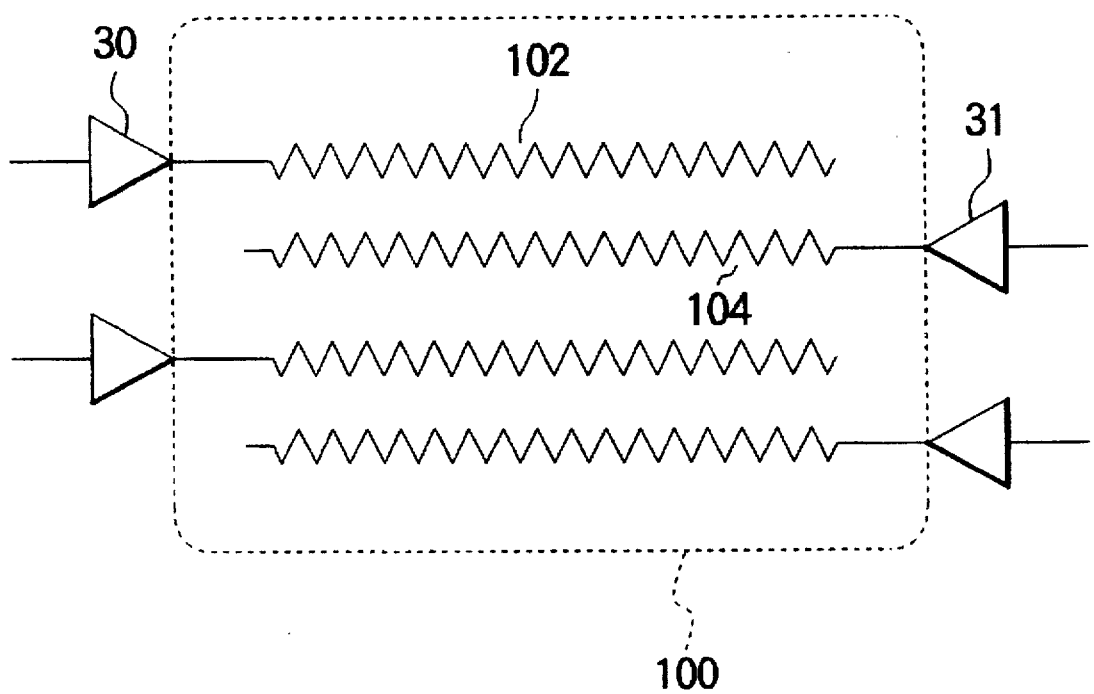
FIG. 15 is a schematic diagram of a prior-art memory cell subarray.

Another useful comparison is with the prior art illustrated in FIG. 15: an array 100 making no use of low-resistance lines, in which driver 30 directly drives high-resistance word line 102 and driver 31 directly drives high-resistance word line 104. If word lines 102 and 104 have half the length of word lines 84 and 90 in FIG. 12, the propagation delay will be substantially the same as in the third embodiment, but for the same total number of memory cells, a semiconductor memory built of arrays of the type in FIG. 15 requires twice as many drivers.

Conversely, if word lines 102 and 104 have the same length as word lines 84 and 90, the propagation delay in FIG. 15 will be substantially four times as great as in FIG. 12. As an improvement on the third strategy of the prior art, the third embodiment can accordingly produce either a major reduction in propagation delay or a major saving of space.

Fourth Embodiment

The fourth embodiment is similar to the third embodiment, but divides each high-resistance line into two physically and electrically distinct segments and provides a separate interconnecting plug for each.

Figure 16:
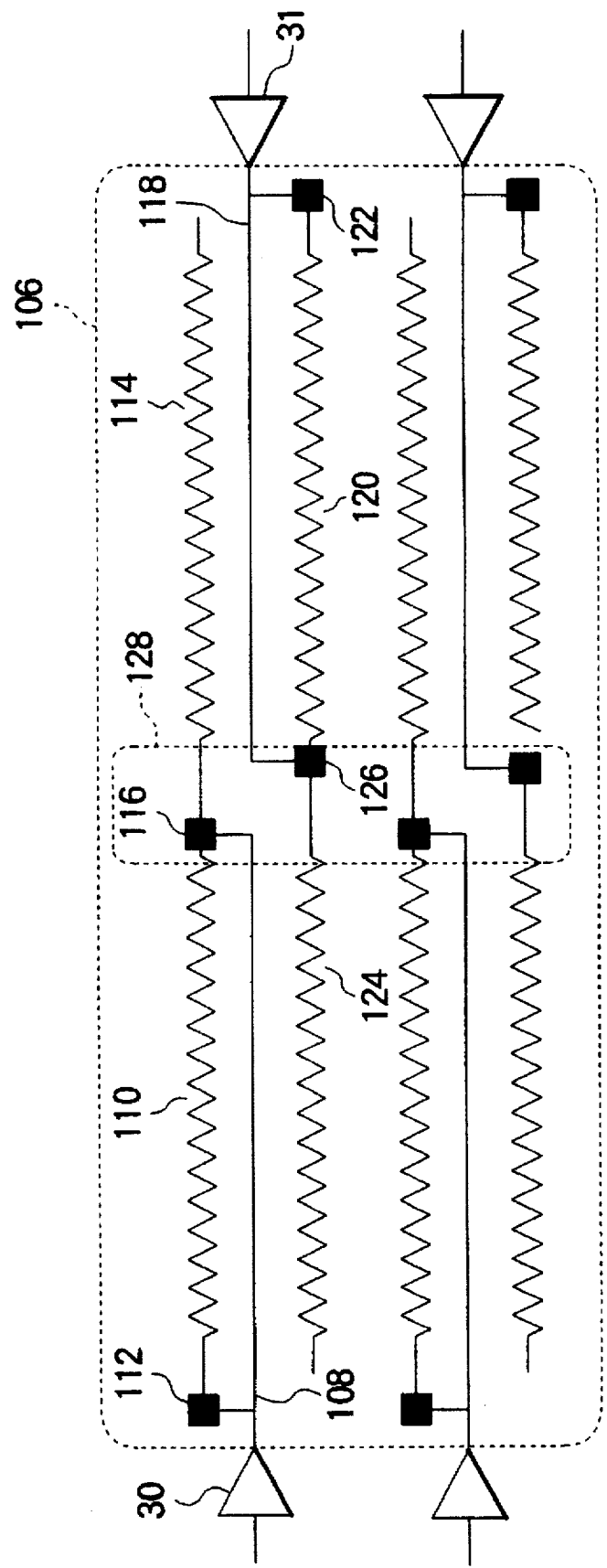
FIG. 16 is a schematic diagram of a memory cell array or subarray illustrating a fourth embodiment of the invention.

Referring to FIG. 16, in the array 106, driver 30 is coupled to low-resistance line 108, which is coupled in turn to high-resistance line segment 110 by interconnecting plug 112 and to high-resistance line segment 114 by interconnecting plug 116. Similarly, driver 31 is coupled to low-resistance line 118, which is coupled in turn to high-resistance line segment 120 by interconnecting plug 122 and to high-resistance line segment 124 by interconnecting plug 126.

Figure 17:
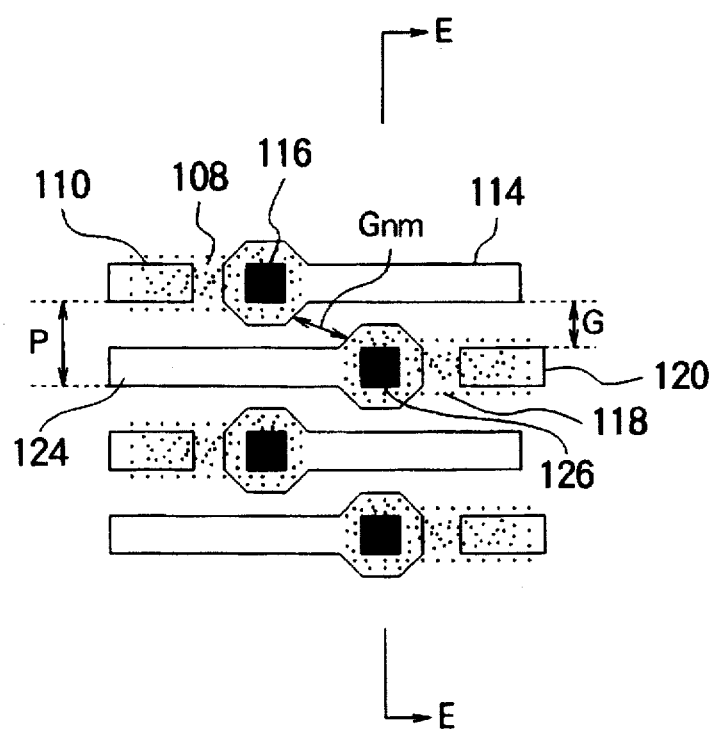
FIG. 17 is a plan view illustrating the layout of the central area in FIG. 16.

Interconnecting plugs 116 and 126 are disposed in the same staggered arrangement as in the third embodiment. The layout of the central area 128 containing these interconnecting plugs is shown in FIG. 17, using the same reference numerals as in FIG. 16. Except for the separation of the high-resistance word lines into segments, the layout is the same as in the third embodiment, and allows an ample space Gnm between the ends of adjacent low-resistance lines.

Figure 18:
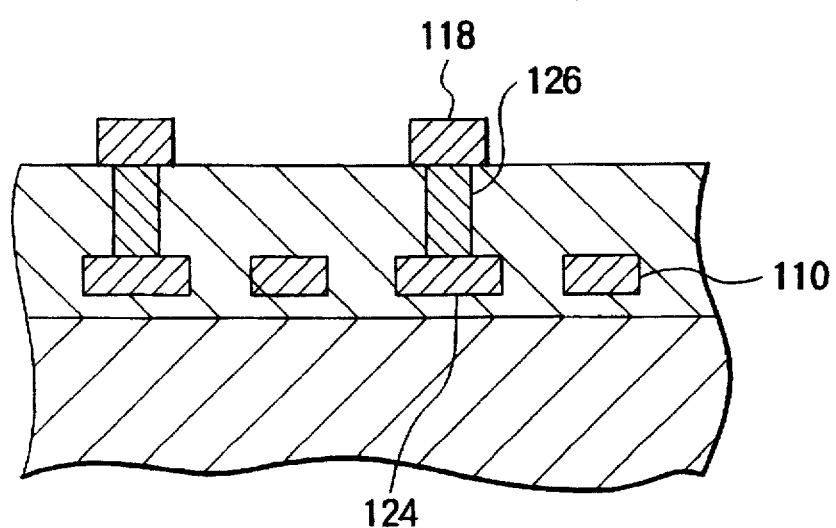
FIG. 18 shows a sectional view through line E—E in FIG. 17.

FIG. 18 is a sectional view through line E—E in FIG. 17, showing the same structure and spacing as in FIG. 14.

The propagation delay on the high-resistance lines in the fourth embodiment is the same as in the third embodiment. The difference concerns the propagation delay due to the resistance of the low-resistance lines.

At very high integration densities, as in semiconductor memories with storage capacities of two hundred fifty-six megabits or higher, the line width is reduced to the point where the electrical resistance of metal lines cannot be ignored. In the third embodiment (FIG. 12), the current charging or discharging the entire capacitive load of word line 84 had to pass through the entire resistance of low-resistance line 82. In the fourth embodiment (FIG. 16), only the current charging or discharging the capacitive load of segment 114 must pass through the full resistance of low-resistance line 108; segment 110 is charged or discharged almost directly from driver 30. The propagation delay due to the resistance of low-resistance line 108 is thus reduced by substantially one-half.

The fourth embodiment can accordingly be used advantageously to reduce propagation delays on word lines in very-high-density semiconductor memories, including semiconductor memories in the gigabit class.

Fifth Embodiment

Figure 19:
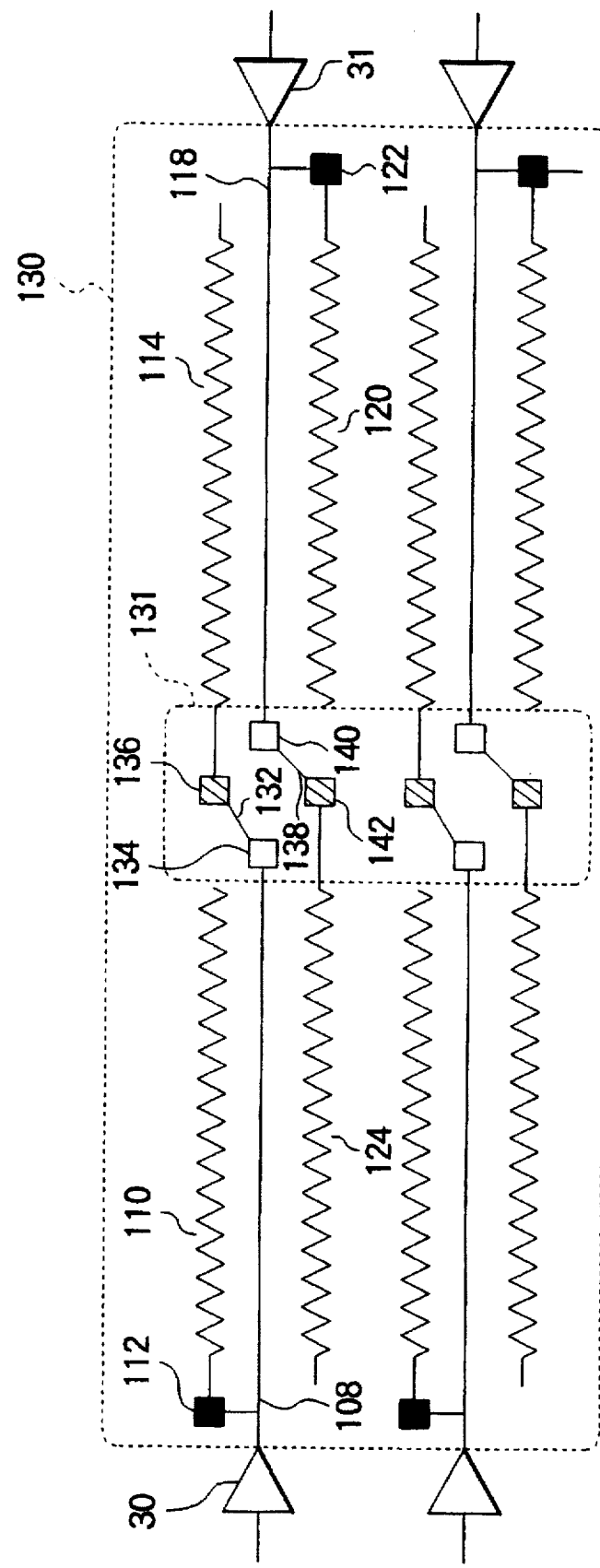
FIG. 19 is a schematic diagram of a memory cell array or subarray illustrating a fifth embodiment of the invention.

Referring to FIG. 19, the array 130 in the fifth embodiment has the same low-resistance lines 108 and 118 and high-resistance line segments 110, 114, 120, and 124 as the fourth embodiment, and the same interconnecting plugs 112 and 122 disposed near drivers 30 and 31, but differs in the structure of the central interconnecting area 131, and in the positional relationship between the high- and low-resistance lines.

In the central area 131, low-resistance line 108 is electrically coupled to high-resistance line 114 through a conductive link 132, which is coupled to low-resistance line 108 by an interconnecting plug 134 and to high-resistance line 114 by an interconnecting plug 136. Similarly, low-resistance line 118 is electrically coupled to high-resistance line 124 through a conductive link 138, which is coupled to low-resistance line 118 by an interconnecting plug 140 and to high-resistance line 124 by an interconnecting plug 144. Interconnecting plugs 134 and 140 comprise the same aluminum material as the low-resistance lines 108 and 118. Conductive links 132 and 138 and interconnecting plugs 136 and 142 comprise the same material as the high-resistance lines 114 and 124, e.g. polysilicon or polycide.

Figure 20:
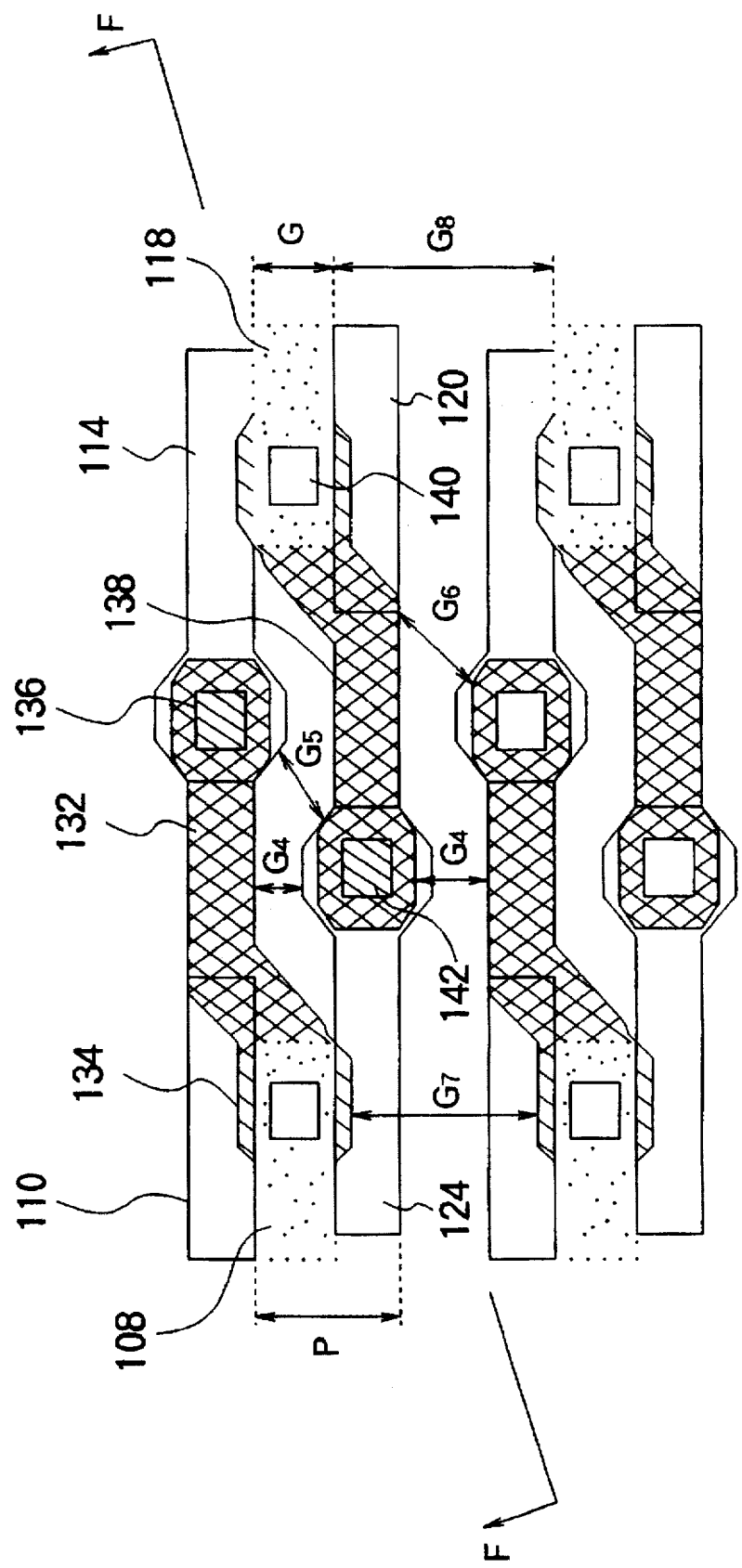
FIG. 20 is a plan view illustrating the layout of the central area in FIG. 19.

The layout of the central interconnecting area 131 is shown in plan view in FIG. 20, using the same reference numerals as in FIG. 19. The low-resistance lines are offset from the high-resistance lines, so that low-resistance line 108, for example, is aligned above the space between high-resistance line segments 110 and 124, and low-resistance line 118 is aligned above the space between high-resistance line segments 114 and 120. Conductive links, such as links 132 and 138, are indicated by cross-hatching.

Figure 21:
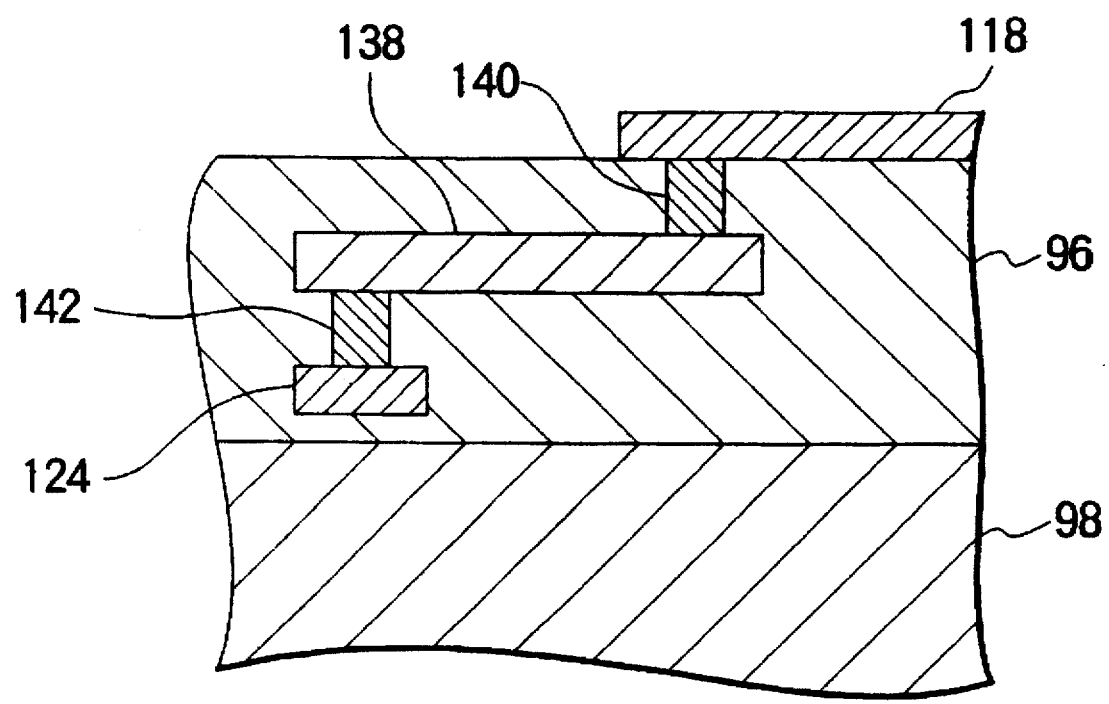
FIG. 21 shows a sectional view through line F—F in FIG. 20.

FIG. 21 shows a sectional view through diagonal line F—F in FIG. 20, passing through conductive link 138 and interconnecting plugs 140 and 142. The high-resistance segments, such as segment 124, are formed in one layer embedded in the insulating film 96 above the semiconductor substrate 98. The conductive links, such as link 138, are formed in another layer embedded in insulating film 96. The low-resistance lines, such as line 118, are formed in still another layer, on the surface of insulating film 96.

Because they extend only as far as the conductive link 138, interconnecting plugs 140 and 138 are each less than half as high as the interconnecting plugs in the preceding embodiments. The necessary mask alignment margin is accordingly less than in the preceding embodiments. Consequently, referring again to FIG. 20, the conductive links 132 and 138 only have to be slightly broadened around interconnecting plugs 136 and 142. The spacing dimension $G_4$ between the broadened part of one conductive link and the adjacent conductive links can therefore be wide enough to obtain good production yields.

As in the first two embodiments, the broadened parts of each high-resistance line are disposed near gaps between the adjacent high-resistance lines above and below. For example, the broadened part of high-resistance line segment 124 is adjacent to the gap between high-resistance line segments 110 and 114. Ample spacing is therefore obtained around the broadened parts of the high-resistance segments, e.g. spacing $G_5$ between the broadened ends of high-resistance segments 114 and 124, and spacing $G_6$ between the end of high-resistance segment 120 and the broadened part of the high-resistance segment below.

The space between the broadened parts of the conductive links at the plugs interconnecting these links to the low-resistance lines are very wide, as indicated by dimension $G_7$, because of the 2P pitch at these points. Similarly, the spacing $G_8$ between adjacent low-resistance lines is very wide.

The propagation delay and word-line length in the fifth embodiment are substantially the same as in the fourth embodiment, but fabrication is easier because of the less stringent spacing conditions around the broadened parts of the high-resistance lines.

Sixth Embodiment

Figure 22:
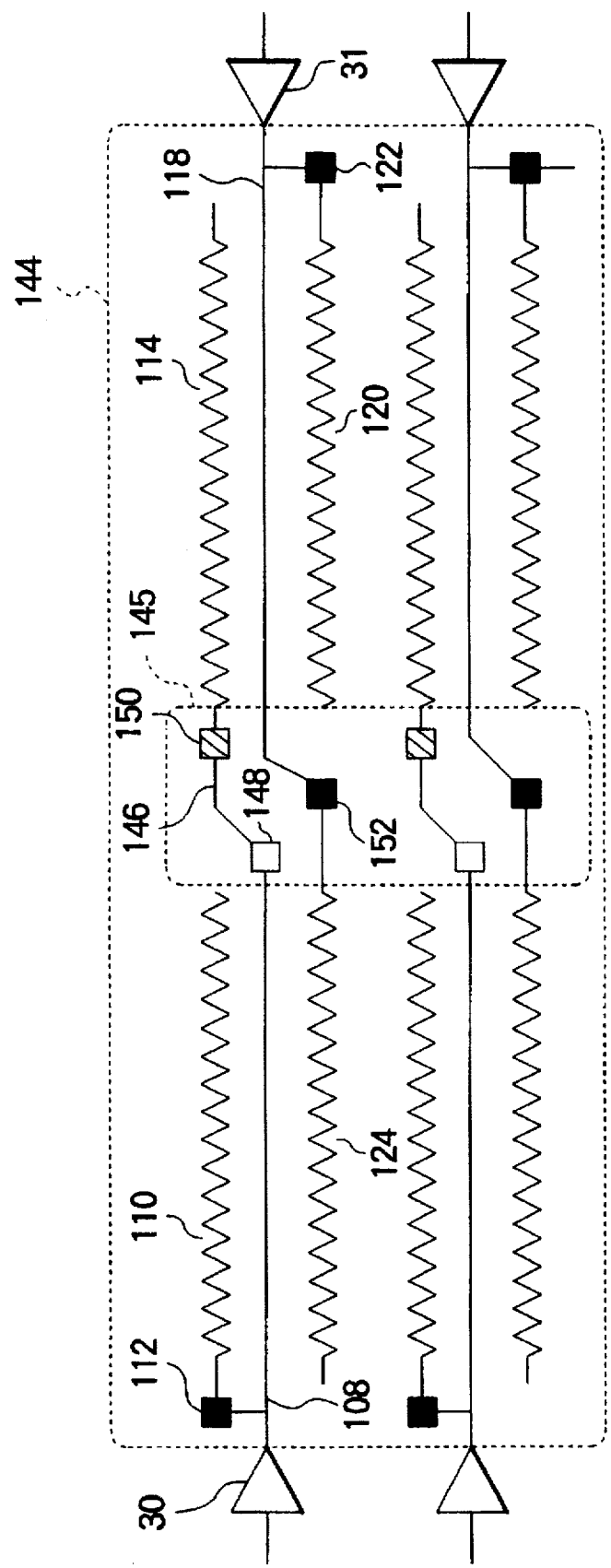
FIG. 22 is a schematic diagram of a memory cell array or subarray illustrating a sixth embodiment of the invention.

Referring to FIG. 22, the array 144 in the sixth embodiment has the same low-resistance lines 108 and 118, high-resistance line segments 110, 114, 120, and 124, and interconnecting plugs 112 and 122 as in the fifth embodiment, but differs in the structure of the central interconnecting area 145.

In the central area 145, low-resistance line 108 is electrically coupled to high-resistance line 114 through a conductive link 146, which is coupled to low-resistance line 108 by an interconnecting plug 148 and to high-resistance line 114 by an interconnecting plug 150. Low-resistance line 118 is coupled to high-resistance line 124 directly through an interconnecting plug 152. Conductive link 146 and interconnecting plug 150 comprise the same material (e.g. polysilicon or polycide) as high-resistance line segment 114. Interconnecting plugs 148 and 152 comprise the same aluminum material as the low-resistance lines 108 and 118.

Figure 23:
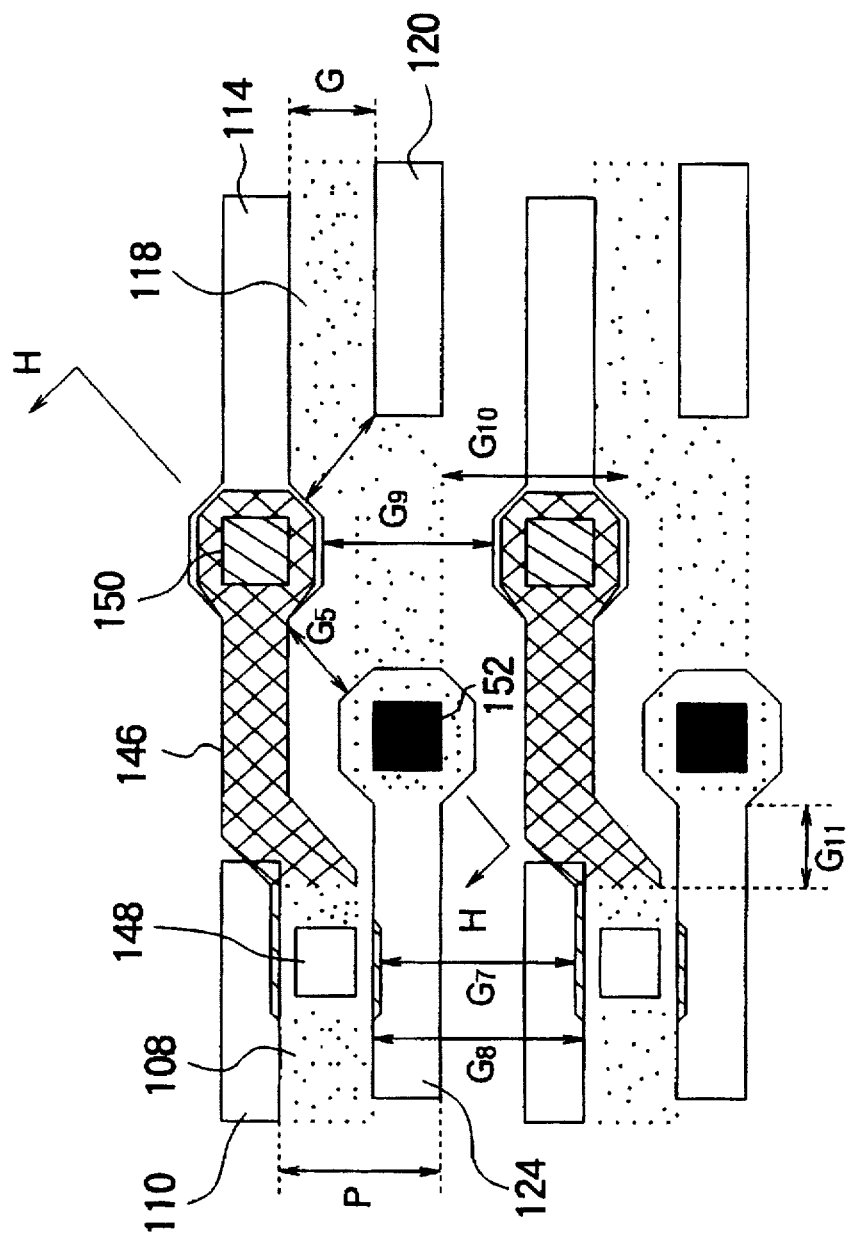
FIG. 23 is a plan view illustrating the layout of the central area in FIG. 22.

The layout of the central area 145 is shown in plan view in FIG. 23, using the same reference numerals as in FIG. 22. As in the fifth embodiment, low-resistance line 108 is disposed above the space between high-resistance segments 110 and 124. Low-resistance line 118 is disposed above the space between high-resistance segments 114 and 120, but makes a detour after the end of high-resistance segment 120 to reach the site of interconnecting plug 152. Conductive link 146 (cross-hatched) has the same layout as conductive link 132 in the fifth embodiment.

Figure 24:
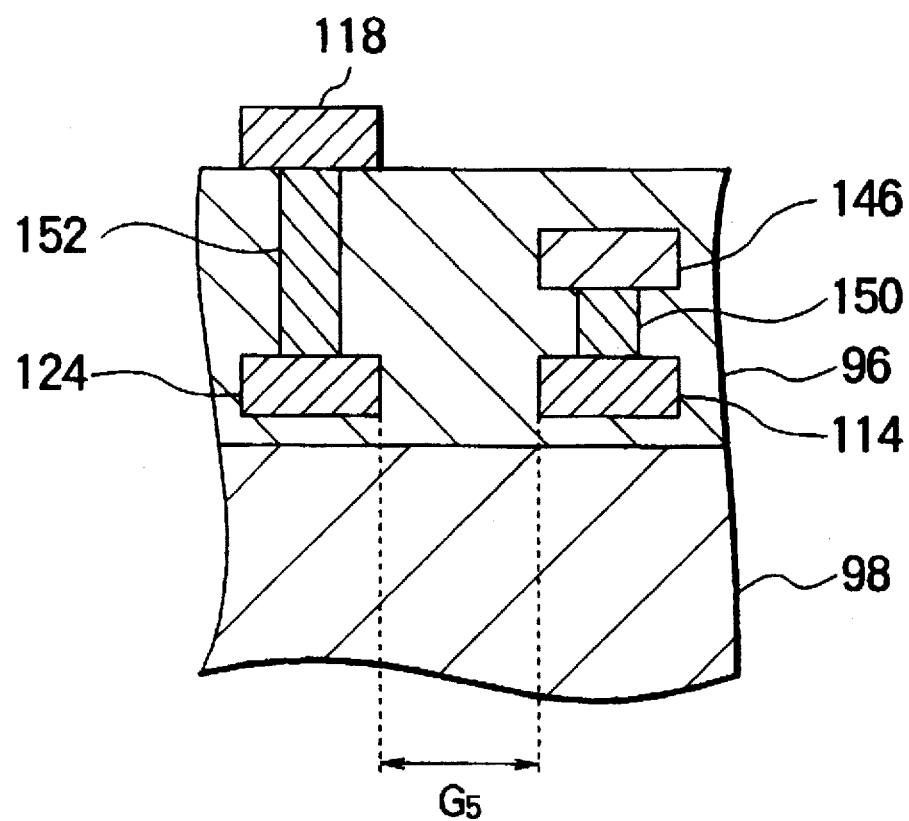
FIG. 24 shows a sectional view through line H—H in FIG. 23.

FIG. 24 shows a sectional view through diagonal line H—H in FIG. 23, passing through the interconnecting plug 150 between conductive link 146 and high-resistance segment 114, and the interconnecting plug 152 between low-resistance line 118 and high-resistance segment 124. As in the fifth embodiment, the interconnecting plugs and conductive links are embedded in the insulating film 96 disposed above a semiconductor substrate 98, the high-resistance lines, conductive links, and low-resistance lines forming three separate layers.

As shown in FIGS. 28 and 24, ample space $G_5$ is obtained between the broadened ends of high-resistance segments 114 and 124. Very generous spacing dimensions $G_7$ and $G_9$ are now obtained between adjacent conductive links at all points, because the pitch at which the conductive links is formed is 2P. Similar large spacing dimensions $G_8$ and $G_{10}$ are obtained between adjacent low-resistance lines, for the same reason, notwithstanding the detours made by the low-resistance lines. An adequate spacing dimension $G_{11}$ is also obtained between the end of one low-resistance line and the end of the next low-resistance line. The interconnection layout of the sixth embodiment is thus very favorable for high-yield fabrication.

The propagation delay and word-line length in the sixth embodiment are substantially the same as in the fourth and fifth embodiments.

Seventh Embodiment

The seventh embodiment adopts the hierarchical wordline structure shown in FIGS. 2 and 3, and routes the main word lines in the same layer as the low-resistance lines.

Figure 25:
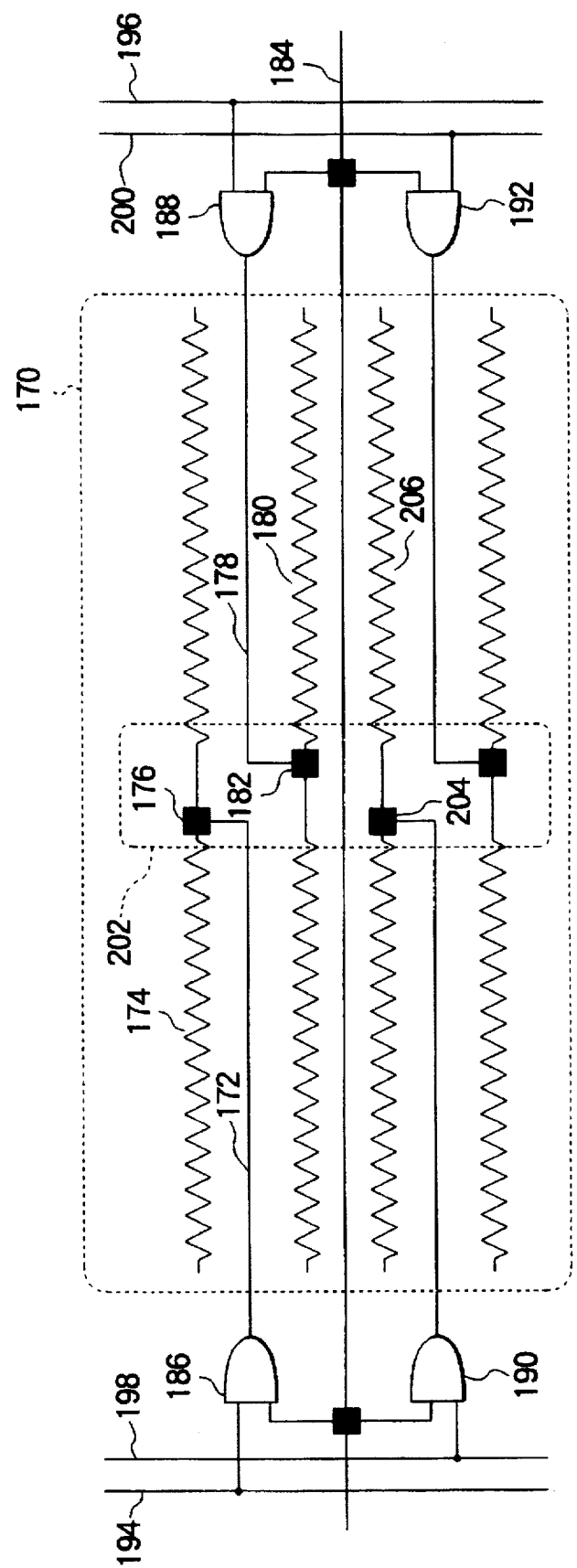
FIG. 25 is a schematic diagram of a memory cell array or subarray illustrating a seventh embodiment of the invention.

Referring to FIG. 25, the seventh embodiment comprises an array 170 in which, as in the third embodiment, a low-resistance line 172 extending from the left side of the array is coupled to a high-resistance line 174 by a single interconnecting plug 176 disposed near the center of high-resistance line 174, and a low-resistance line 178 extending from the right side of the array is coupled to a high-resistance line 180 by a single interconnecting plug 182 disposed near the center of high-resistance line 180.

A main word line 184 also extends across the array 170, driving low-resistance lines 172 and 178 and two more low-resistance lines through four two-input AND gates 186, 188, 190, and 192. The main word line 184 provides one input to each of these two-input AND gates. The other inputs are provided by respective address lines 194, 196, 198, and 200. The AND gates 186, 188, 190, and 192 are subsidiary wordline drivers with the same driving function as the drivers 30 and 31 and other drivers shown in the preceding embodiments, but are controlled by the main word line 184 and address lines 194, 196, 198, and 200.

The array 170 can be enlarged by repetition of the pattern shown in FIG. 25. The main word line 184 may also be coupled to other arrays (not shown).

Figure 26:
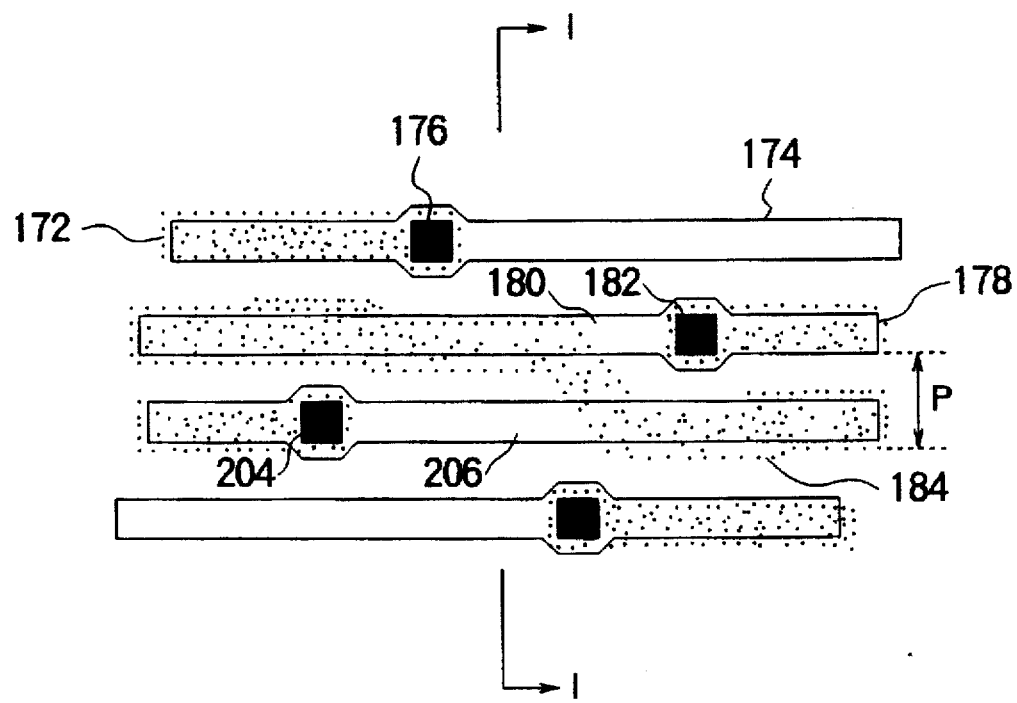
FIG. 26 is a plan view illustrating the layout of the central area in FIG. 25.

The layout of the central area 202 in FIG. 25, comprising interconnecting plugs 176 and 182 and the interconnecting plug 204 of high-resistance line 206, is shown in plan view in FIG. 26, using the same reference numerals as in FIG. 25. In the left half of the array, the main word line 184 is disposed above high-resistance line 180. In the central area, the main word line makes slight detours to avoid the broadened parts of the low-resistance lines around interconnecting plugs 176 and 204, then makes a larger detour to avoid the broadened part of low-resistance line 178 around interconnecting plug 182, and continues to the right above high-resistance line 206. This layout enables the main word line 184 to be placed in the same layer as the low-resistance lines 172 and 178 while leaving ample space between the main word line 184 and those low-resistance lines 172 and 178.

Figure 27:
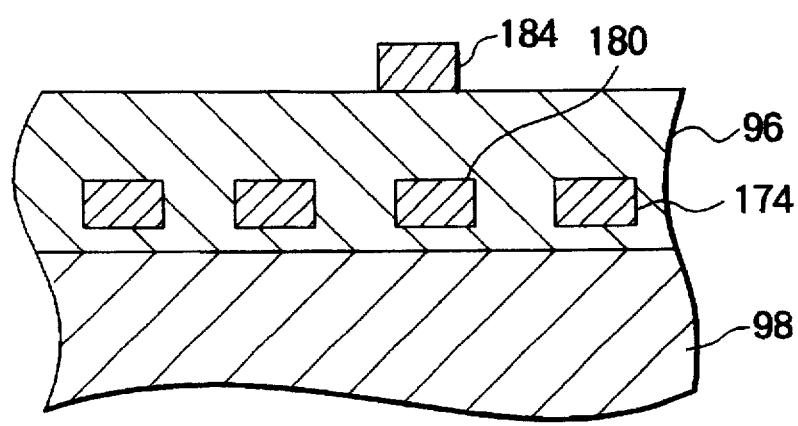
FIG. 27 shows a sectional view through line I—I in FIG. 26.

FIG. 27 shows a sectional view through line I—I in FIG. 26, where the main word line 184 is disposed above high-resistance line 180, with a slight offset. All of the main word lines and all of the low-resistance lines are formed in a single layer on the surface of the insulating film 96 overlying the semiconductor substrate 98. Placing the main word lines, such as line 184, in the same layer as the low-resistance lines enables the number of metalization process steps to be minimized, thereby lowering the cost of the memory device. Alternatively, it enables the metal interconnection layer that would otherwise have been devoted to the main word lines to be used for another purpose, such as column lines.

Referring again to FIG. 26, in the right or left half of the array, since two low-resistance lines and one main word line 184 occupy the same space as four high-resistance lines, the average line pitch in the layer comprising the low-resistance lines and main word lines is 1.33P, where P is the pitch of the high-resistance lines. Although the actual spacing of the low-resistance lines and main word lines is not uniform in FIG. 26, this spacing can be made uniform by using polysilicon or polycide conductive links to couple the low-resistance lines to the high-resistance lines, as in the fifth and sixth embodiments. That modification does not require any change in the layout of the high-resistance lines, and makes the metalization process significantly easier to carry out.

The detours made by the main word lines add slightly to the overall word-line length, making the central interconnecting area 202 in FIG. 25 is slightly wider than the corresponding area 94 in FIG. 12. Array 170 in the seventh embodiment is consequently slightly wider than array 81 in the third embodiment. The total word-line length in the seventh embodiment is still much shorter, however, than in the prior art illustrated in FIG. 15, which uses twice as many drivers to achieve the same reduction in propagation delay, or in other prior art (not illustrated) which provides additional "repeater" drivers comprising active elements within the array itself, coupled in series with the high-resistance line segments.

The scheme shown in the seventh embodiment of routing main word lines in the same layer as low-resistance subsidiary word lines can also be adopted in the fourth, fifth, and sixth embodiments, in which the high-resistance lines are divided into two segments each.

Further variations are also possible, including but not limited to the following.

The drivers shown on the right and left sides of the arrays in the first six embodiments may have various input configurations. The drivers may be driven by a single input as shown in the drawings, or may function as two-input logic gates as in the seventh embodiment, or may function in other ways. The drivers may be driven by main word lines disposed in a separate metal interconnection layer, or in the same metal interconnection layer, or may be driven directly from the x-decoder. That is, the drivers can be combined with the x-decoder circuit illustrated in FIG. 1.

In the first two embodiments, all the drivers may be placed on one side of the memory cell array.

Applications of the invention are not restricted to dynamic random-access memories, but also include static random-access memories, non-volatile memories such as flash memories, and other memories in which closely-spaced word lines are coupled to large numbers of memory cells.

Those skilled in the art will recognize that further modifications can be made within the scope claimed below.

What is claimed is:

1. A semiconductor memory having a plurality of memory cells, comprising:

a plurality of drivers for generating signals that select said memory cells;

a plurality of mutually parallel first signal lines disposed in a first layer, said memory cells being connected to said first signal lines, each of said first signal lines being divided into at least two collinear segments separated by gaps, and said first signal lines having a first electrical resistivity;

a like plurality of second signal lines disposed in a second layer, different from said first layer, said second signal lines running parallel to said first signal lines, said second signal lines being coupled, respectively, to said plurality of drivers, and said second signal lines having a second electrical resistivity less than said first electrical resistivity; and a plurality of interconnecting plugs electrically connecting said first signal lines to said second signal lines, said plugs connected to one of said first signal lines being respectively disposed near said gaps in an adjacent one of said first signal lines.

2. The semiconductor memory of claim 1, wherein said second signal lines comprise a metal material.

3. The semiconductor memory of claim 2, wherein said metal material is tungsten.

4. The semiconductor memory of claim 2, wherein said metal material is aluminum.

5. The semiconductor memory of claim 1, wherein said second signal lines have broadened portions making electrical contact with said interconnecting plugs, and are laid out with detours to maintain a certain minimum spacing around the broadened portions of adjacent second signal lines.

6. The semiconductor memory of claim 1, wherein:

said plurality of memory cells are disposed in an array;

said plurality of drivers are disposed on a first side of said array and a second side of said array; and a first one of said first signal lines is electrically connected to one of said second signal lines, that is coupled to one of said drivers which is disposed on said first side of said array, and said first one of said first signal lines is disposed adjacent to another one of said first signal lines which is electrically connected to another one of said second signal lines that is coupled to another one of said drivers which is disposed on said second side of said array.

7. The semiconductor memory of claim 1, wherein:

one of said plurality of first signal lines is between two adjacent ones of said plurality of first signal lines, and a gap from among said gaps in said one first signal line is adjacent to two interconnecting plugs connected to said two adjacent first signal lines, respectively;

said two interconnecting plugs being mutually offset from each other in a direction running parallel to said first signal lines; and one of said plurality of second signal lines which is electrically connected to said one first signal line is laid out with detours around said two interconnecting plugs.

8. A semiconductor memory having memory cells organized into at least one array, comprising:

a plurality of first drivers disposed on a first side of said array, for generating signals that select said memory cells;

a plurality of second drivers disposed on a second side of said array opposite to said first side, for generating signals that select said memory cells;

a plurality of mutually parallel first signal lines disposed in a first layer, said first signal lines extending across said array from said first side to said second side, said memory cells being connected to said first signal lines, and said first signal lines having a first electrical resistivity;

a plurality of second signal lines disposed in a second layer parallel to said first layer, said second signal lines being coupled to respective first drivers, said second signal lines extending from said first side of said array to a central area disposed midway between said first side and said second side, said second signal lines being coupled to respective first signal lines in said central area, and said second signal lines having a second electrical resistivity less than said first electrical resistivity;

a plurality of third signal lines disposed in said second layer, said third signal lines being coupled to respective second drivers, said third signal lines extending from said second side of said array to said central area, said third signal lines being coupled to respective first signal lines in said central area, and said third signal lines also having said second electrical resistivity;

wherein each one of said first signal lines is electrically coupled to just one corresponding signal line among said second signal lines and said third signal lines; and the first signal lines electrically coupled to said second signal lines are disposed alternately with the first signal lines electrically coupled to said third signal lines, as viewed in a direction perpendicular to said first signal lines.

9. The semiconductor memory of claim 8, wherein:

said second signal lines have broadened ends, to which respective first signal lines are coupled in said central area;

said third signal lines have broadened ends, to which respective first signal lines are coupled in said central area; and the broadened ends of said second signal lines are disposed closer to said first side of said array than are the broadened ends of said third signal lines.

10. The semiconductor memory of claim 8, wherein said second signal lines and said third signal lines comprise a metal material.

11. The semiconductor memory of claim 10, wherein said metal material is aluminum.

12. The semiconductor memory of claim 8, further comprising a plurality of fourth signal lines disposed in said second layer, for controlling said first drivers and said second drivers, said fourth signal lines extending across said array from said first side to said second side, said fourth signal lines also having said second electrical resistivity, and each of said fourth signal lines being coupled to at least one of said first drivers and at least one of said second drivers.

13. The semiconductor memory of claim 12, wherein said first drivers and said second drivers function as logic gates having said fourth signal lines as first inputs and address signals as second inputs.

14. A semiconductor memory having memory cells organized into at least one array, comprising:

a plurality of first drivers disposed on a first side of said array, for generating signals that select said memory cells;

a plurality of second drivers disposed on a second side of said array opposite to said first side, for generating signals that select said memory cells;

a plurality of mutually parallel first signal lines disposed in a first layer, said memory cells being connected to said first signal lines, said first signal lines having a first electrical resistivity, and said first signal lines being divided into respective first segments and second segments, said first segments extending from said first side of said array to a central area disposed midway between said first side and said second side, said second segments extending from said second side of said array to said central area, and said first segments being separated from respective second segments by respective gaps in said central area;

a plurality of second signal lines disposed in a second layer, said second signal lines being coupled to respective first drivers, said second signal lines extending from said first side of said array to said central area, said second signal lines being coupled to the first segments of respective first signal lines at said first side of said array, said second signal lines being coupled to the second segments of respective first signal lines in said central area, and said second signal lines having a second electrical resistivity less than said first electrical resistivity;

a plurality of third signal lines disposed in said second layer, said third signal lines being coupled to respective second drivers, said third signal lines extending from said second side of said array to said central area, said third signal lines being coupled to the second segments of respective first signal lines at said second side of said array, said third signal lines being coupled to the first segments of respective first signal lines in said central area, and said third signal lines also having said second electrical resistivity;

wherein each one of said first signal lines is electrically coupled to just one corresponding signal line among said second signal lines and said third signal lines; and the first signal lines electrically coupled to said second signal lines are disposed alternately with the first signal lines electrically coupled to said third signal lines, as viewed in a direction perpendicular to said first signal lines.

15. The semiconductor memory of claim 14, wherein:

said second signal lines have broadened ends, to which the second segments of respective first signal lines are coupled in said central area;

said third signal lines have broadened ends, to which the first-segments of respective first signal lines are coupled in said central area; and the broadened ends of said second signal lines are disposed closer to said first side of said array than are the broadened ends of said third signal lines.

16. The semiconductor memory of claim 14, wherein said second signal lines and said third signal lines comprise a metal material.

17. The semiconductor memory of claim 16, wherein said metal material is aluminum.

18. The semiconductor memory of claim 14, further comprising a plurality of first conductive links disposed in said central area, said second signal lines being coupled to said second segments of respective first signal lines through said first conductive links, and said first conductive links being disposed in a third layer located between said first layer and said second layer.

19. The semiconductor memory of claim 18, wherein said first conductive links have said first electrical resistivity.

20. The semiconductor memory of claim 18, further comprising a plurality of second conductive links disposed in said central area, said third signal lines being coupled to said first segments of respective first signal lines through said second conductive links, and said second conductive links being disposed in said third layer.

21. The semiconductor memory of claim 20, wherein said second conductive links have said first electrical resistivity.

22. The semiconductor memory of claim 14, further comprising a plurality of fourth signal lines disposed in said second layer, for controlling said first drivers and said second drivers, said fourth signal lines extending across said array from said first side to said second side, said fourth signal lines having said second electrical resistivity, and each of said fourth signal lines being coupled to at least one of said first drivers and at least one of said second drivers.

23. The semiconductor memory of claim 22, wherein said first drivers and said second drivers function as logic gates having said fourth signal lines as first inputs and address signals as second inputs.

* * * * *